United States Patent
Nozu

(10) Patent No.: US 12,210,064 B2
(45) Date of Patent: Jan. 28, 2025

(54) SAFE STATE DETECTION METHOD FOR LITHIUM-ION SECONDARY BATTERY, SAFE STATE DETECTION APPARATUS, POWER STORAGE DEVICE, SAFE STATE DETECTION SYSTEM, AND RECORDING MEDIUM

(71) Applicant: Ryutaro Nozu, Kanagawa (JP)

(72) Inventor: Ryutaro Nozu, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 40 days.

(21) Appl. No.: 18/121,590

(22) Filed: Mar. 15, 2023

(65) Prior Publication Data

US 2023/0296682 A1   Sep. 21, 2023

(30) Foreign Application Priority Data

Mar. 17, 2022 (JP) .............................. 2022-043087
Feb. 8, 2023 (JP) .............................. 2023-017791

(51) Int. Cl.
  *G01R 31/3842* (2019.01)
  *G01R 31/389* (2019.01)
  *H02J 7/00* (2006.01)

(52) U.S. Cl.
  CPC ....... *G01R 31/3842* (2019.01); *G01R 31/389* (2019.01); *H02J 7/00302* (2020.01)

(58) Field of Classification Search
  None
  See application file for complete search history.

(56) References Cited

U.S. PATENT DOCUMENTS

2015/0288200 A1  10/2015  Partes et al.
2022/0158468 A1*  5/2022  Cha .......................... B60L 3/12

FOREIGN PATENT DOCUMENTS

| CN | 207515944 U | 6/2018 |
| CN | 113054271 A | 6/2021 |
| JP | 2014-017982 | 1/2014 |
| JP | 2023-009939 | 1/2023 |

(Continued)

OTHER PUBLICATIONS

Ryutaro Nozu, et al., "Dual-ion battery using graphitic carbon and Li4Ti5O12: Suppression of gas formation and increased cyclability", Electrochimica Acta 332 (2020) 135238, p. 1-11.

(Continued)

*Primary Examiner* — Jas A Sanghera
(74) *Attorney, Agent, or Firm* — XSENSUS LLP

(57) ABSTRACT

A safe state detection method for a lithium-ion secondary battery, includes: calculating an absolute value of a differential coefficient of a discharge curve from which a voltage equivalent to a voltage drop of the lithium-ion secondary battery is removed; determining a first battery voltage when the degree of increase in the absolute value of the differential coefficient is greater than a threshold value; determining a second battery voltage at a start of an increase in oxidation heat in response to the first battery voltage, the oxidation heat being heat generated inside the lithium-ion secondary battery when the lithium-ion secondary battery is overcharged; and detecting a safe state of the lithium-ion secondary battery, based on the determined second battery voltage.

13 Claims, 22 Drawing Sheets

(56) References Cited

FOREIGN PATENT DOCUMENTS

KR   10-2017-0078201 A   7/2017

OTHER PUBLICATIONS

Ryutaro Nozu, et al., "Investigation of the life process of the electric double layer capacitor during float charging", Journal of Power Sources 186 (2009) 570-579, p. 570-579.
Ryutaro Nozu, et al., "Studying a Phenomenon During Overcharge of a Lithium-Ion Battery with Methacrylate Additives for the Gel Electrolyte", Journal of the Electrochemical Society, 153 (6) A1031-A1037(2006), p. A1031-A1037.
Ryutaro Nozu, et al., "Tetraethylammonium tetrafluoroborate additives for suppressed gas formation and increased cycle stability of dual-ion battery", Electrochimica Acta 337 (2020) 135711, p. 1-14.
Extended European Search Report issued Aug. 12, 2024 in European Patent Application No. 23162350.5, 5 pages.

\* cited by examiner

SAFE STATE DETECTION METHOD FOR LITHIUM-ION SECONDARY BATTERY, SAFE STATE DETECTION APPARATUS, POWER STORAGE DEVICE, SAFE STATE DETECTION SYSTEM, AND RECORDING MEDIUM

CROSS-REFERENCE TO RELATED APPLICATIONS

This patent application is based on and claims priority pursuant to 35 U.S.C. § 119(a) to Japanese Patent Application Nos. 2022-043087, filed on Mar. 17, 2022, and 2023-017791, filed on Feb. 8, 2023, in the Japan Patent Office, the entire disclosure of which is hereby incorporated by reference herein.

BACKGROUND

Technical Field

The present disclosure relates to a safe state detection method for a lithium-ion secondary battery, a safe state detection apparatus, a power storage device, a safe state detection system, and a recording medium.

Related Art

Recently, demands for lithium-ion secondary batteries are increasing as power supplies for mobile devices, hybrid automobiles, electric automobiles, power storage, and so on. Lithium-ion secondary batteries are storage batteries having a high mass energy density. Thus, concerns about the safety of the batteries when the batteries are overcharged are a constant issue.

Such an issue is addressed by techniques for detecting a safe state of a lithium-ion secondary battery in the related art. For example, there is a technique of cooling an abnormally heated lithium-ion secondary battery in response to a sensor detecting an abnormal temperature change in the lithium-ion secondary battery.

However, such a system for detecting a safe state of a lithium-ion secondary battery only successfully determines an unsafe state of the lithium-ion secondary battery after or immediately before the lithium-ion secondary battery enters the unsafe state.

SUMMARY

According to an embodiment of the present disclosure, a safe state detection method for a lithium-ion secondary battery, includes calculating an absolute value of a differential coefficient of a discharge curve from which a voltage equivalent to a voltage drop of the lithium-ion secondary battery is removed; determining a first battery voltage when the degree of increase in the absolute value of the differential coefficient is greater than a threshold value, determining a second battery voltage at a start of an increase in oxidation heat in response to the first battery voltage, the oxidation heat being heat generated inside the lithium-ion secondary battery when the lithium-ion secondary battery is overcharged; and detecting a safe state of the lithium-ion secondary battery, based on the determined second battery voltage.

According to another embodiment of the present disclosure, a safe state detection apparatus includes circuitry, which calculates an absolute value of a differential coefficient of a discharge curve from which a voltage equivalent to a voltage drop of a lithium-ion secondary battery is removed, and determines a first battery voltage when the degree of increase in the absolute value of the differential coefficient is greater than a threshold value. The circuitry determines a second battery voltage at a start of an increase in oxidation heat in response to the first battery voltage, the oxidation heat being heat generated inside the lithium-ion secondary battery when the lithium-ion secondary battery is overcharged. The circuitry detects a safe state of the lithium-ion secondary battery, based on the determined second battery voltage.

According to another embodiment of the present disclosure, a power storage device includes a lithium-ion secondary battery, and a protection circuit. The protection circuit functions as the safe state detection apparatus described above.

According to another embodiment of the present disclosure, a safe state detection system includes a lithium-ion secondary battery, and the safe state detection apparatus described above.

According to another embodiment of the present disclosure, a recording medium storing a plurality of instructions which, when executed by one or more processors, causes the processors to perform the above-described method.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein.

Figure 1:
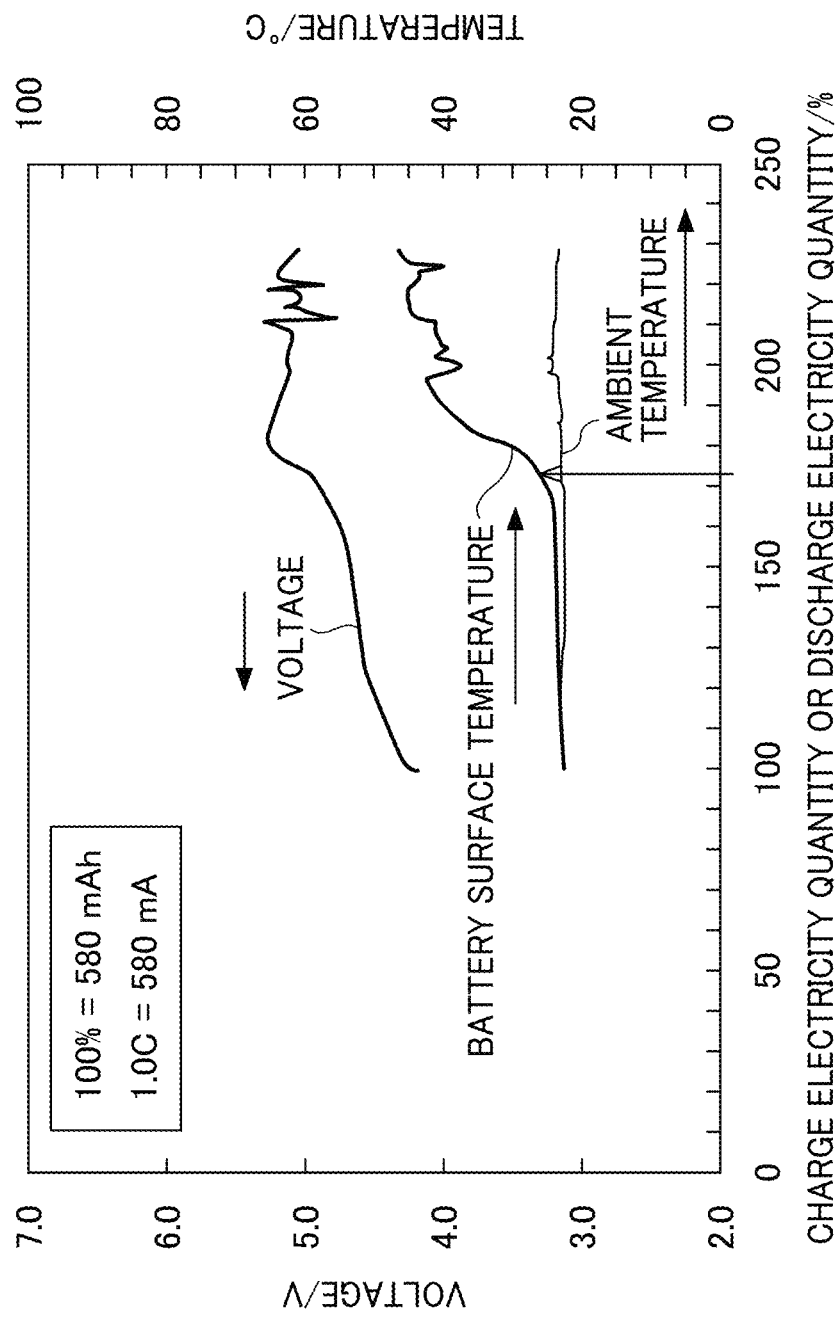
FIG. 1 illustrates a relationship between a voltage and a charge electricity quantity or discharge electricity quantity of a lithium-ion battery cell with a liquid electrolyte containing no methacrylic acid compound.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a", "an," and "the" are intended to include the plural forms as well, unless the context clearly indicates otherwise.

Figure 18:
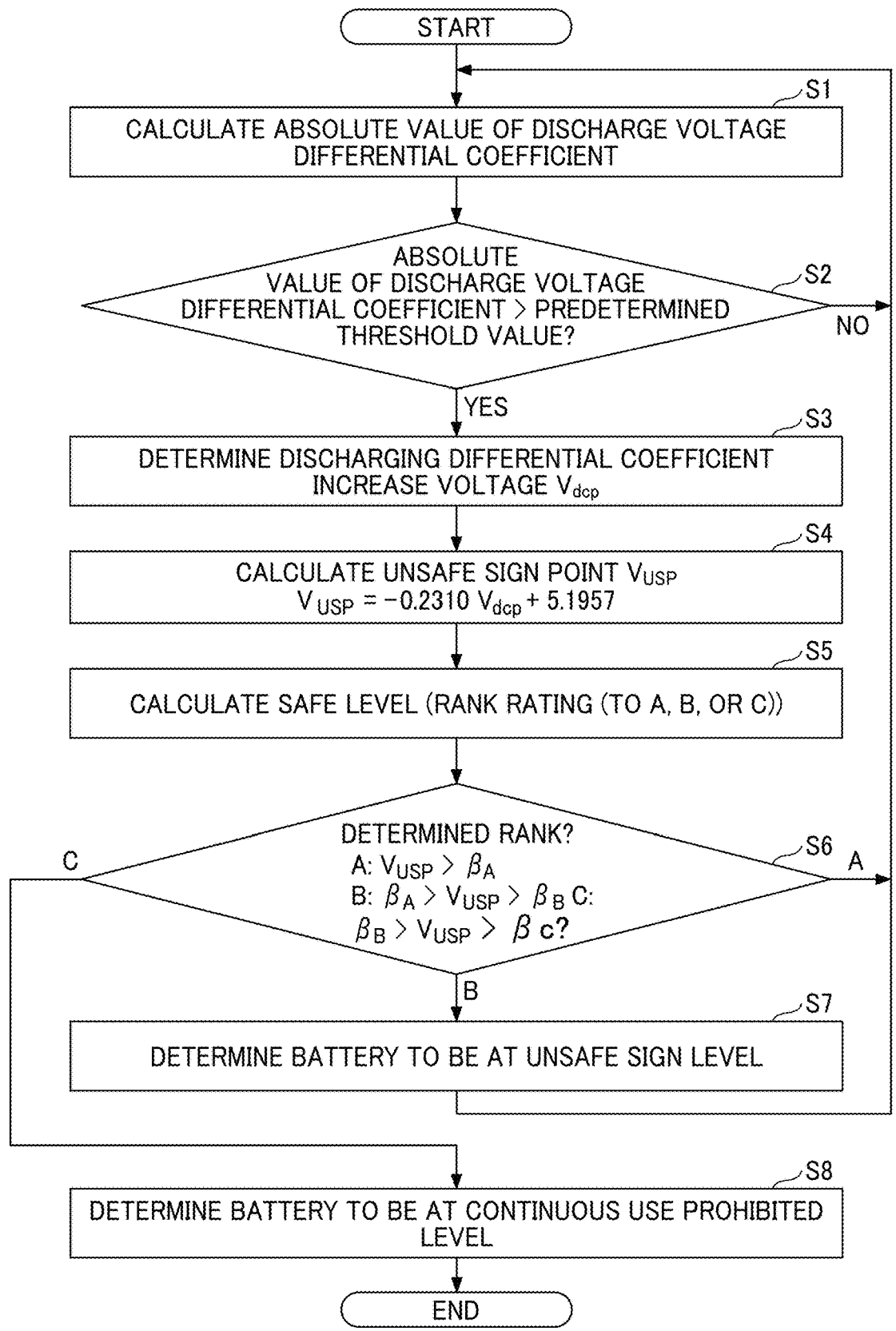
FIG. 18 is a flowchart for carrying out a method for detecting a safe state of a lithium-ion secondary battery.

Embodiments of the present disclosure will be described below. FIG. 18 is a flowchart for carrying out a method for detecting a safe state of a lithium-ion secondary battery.

A safe state detection method for a lithium-ion secondary battery (hereinafter, referred to as a safe state detection method or a detection method in some cases) according to the present embodiment is a method for detecting a safe state of a lithium-ion secondary battery.

A heat generation point is a point at which an internal state of a lithium-ion secondary battery transitions from a heat absorbing state to a heat generating state when the lithium-ion secondary battery in use is overcharged. The inventor has found out that the heat generation point depends on deterioration of the lithium-ion secondary battery, and has conceived a method for predicting an unsafe state of the lithium-ion secondary battery from this heat generation point.

Specifically, in a lithium-ion battery cell with a liquid electrolyte containing no methacrylic acid compound, after the charge electricity quantity exceeds 170% during overcharging, the surface temperature of the battery cell increases and gas is generated inside the battery cell. The generated gas destroys a sealed state of the battery cell, consequently making the battery cell no longer dischargeable (see FIG. 1).

Figure 2:
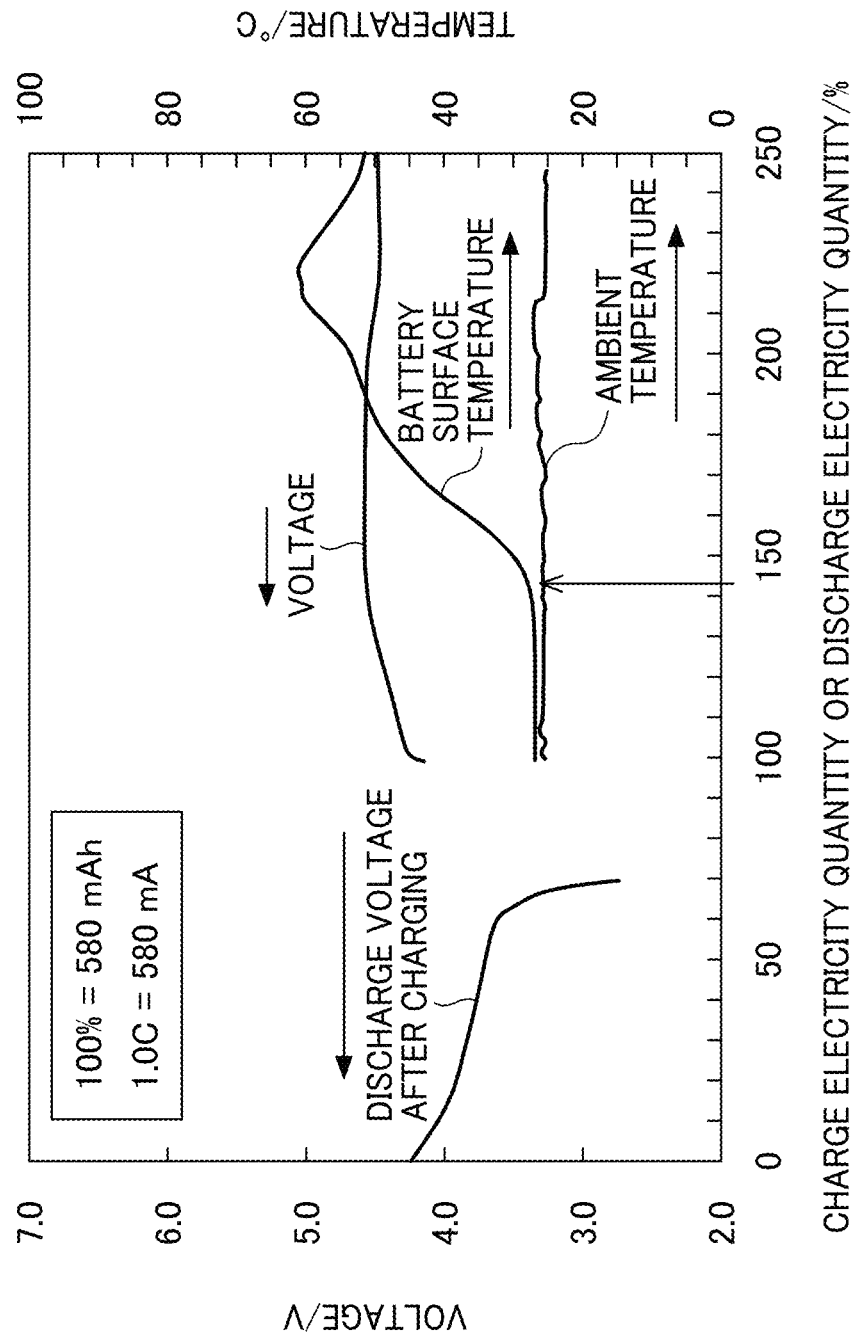
FIG. 2 illustrates a relationship between a voltage and a charge electricity quantity or discharge electricity quantity of a lithium-ion battery cell with a liquid electrolyte containing a methacrylic acid compound.

In contrast, in a lithium-ion battery cell with a liquid electrolyte containing a methacrylic acid compound, the voltage increase is not observed when the lithium-ion battery cell is overcharged. Thus, gas is not generated. Even after the lithium-ion battery cell is overcharged to 250%, the lithium-ion battery cell is dischargeable and ensures a discharge capacity (see FIG. 2).

However, the surface temperature increases at an earlier timing, specifically, at a timing corresponding to the charge electricity quantity of about 130% during overcharging, in the lithium-ion battery cell with a liquid electrolyte containing a methacrylic acid compound than in the lithium-ion secondary battery cell with a liquid electrolyte containing no methacrylic acid compound. This indicates that an oxidation reaction is occurring inside the battery cell even if gas is not generated.

Figure 3:
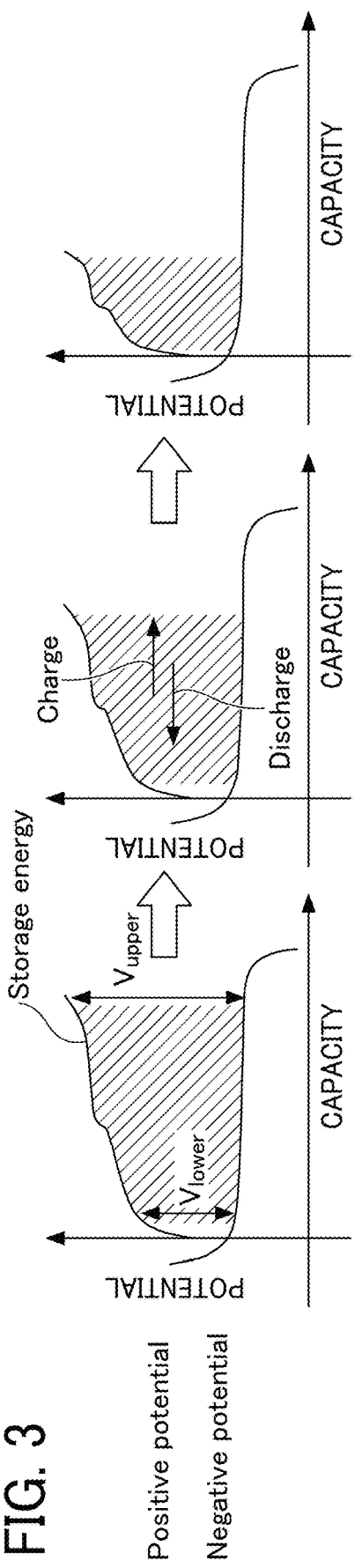
FIG. 3 illustrates a relationship among a capacity, a positive electrode potential, and a negative electrode potential of a secondary battery when a positive electrode capacity decreases.
Figure 4:
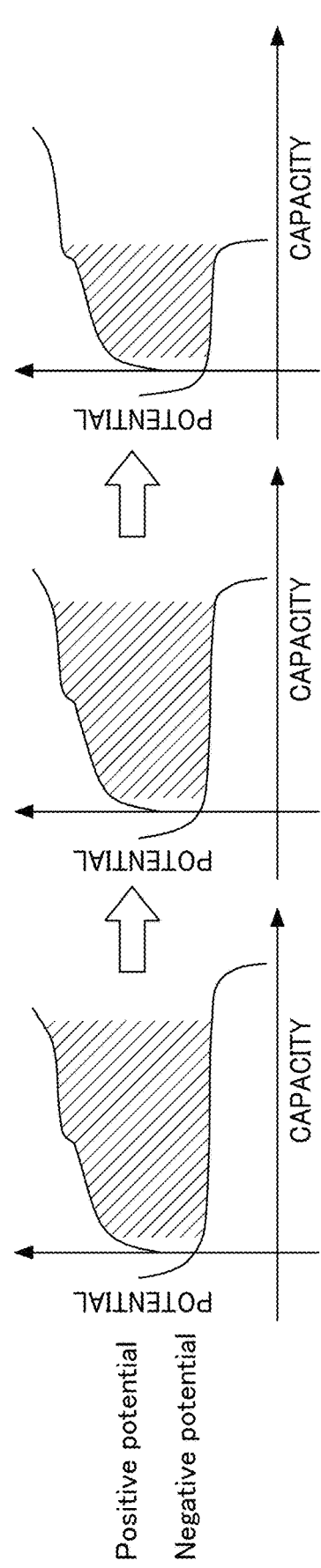
FIG. 4 illustrates a relationship among a capacity, a positive electrode potential, and a negative electrode potential of a secondary battery when a negative electrode capacity decreases.
Figure 5:
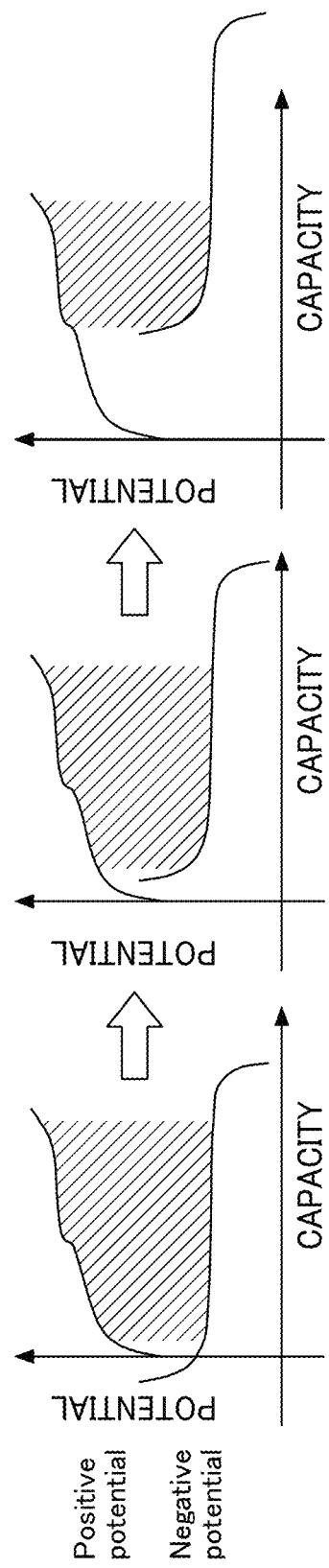
FIG. 5 illustrates a relationship among a capacity, a positive electrode potential, and a negative electrode potential of a secondary battery when the state of charge shifts between the positive electrode and the state of charge.

Even at the same battery voltage, the chargeable/dischargeable electric capacity of a lithium-ion secondary battery decreases as the number of cycles of the battery increases. The chargeable/dischargeable electric capacity also decreases when the state of charge at a positive electrode and the state of charge at a negative electrode shift from each other because of a side reaction or self-discharge in the battery (see FIGS. 3 to 5).

Figure 6:
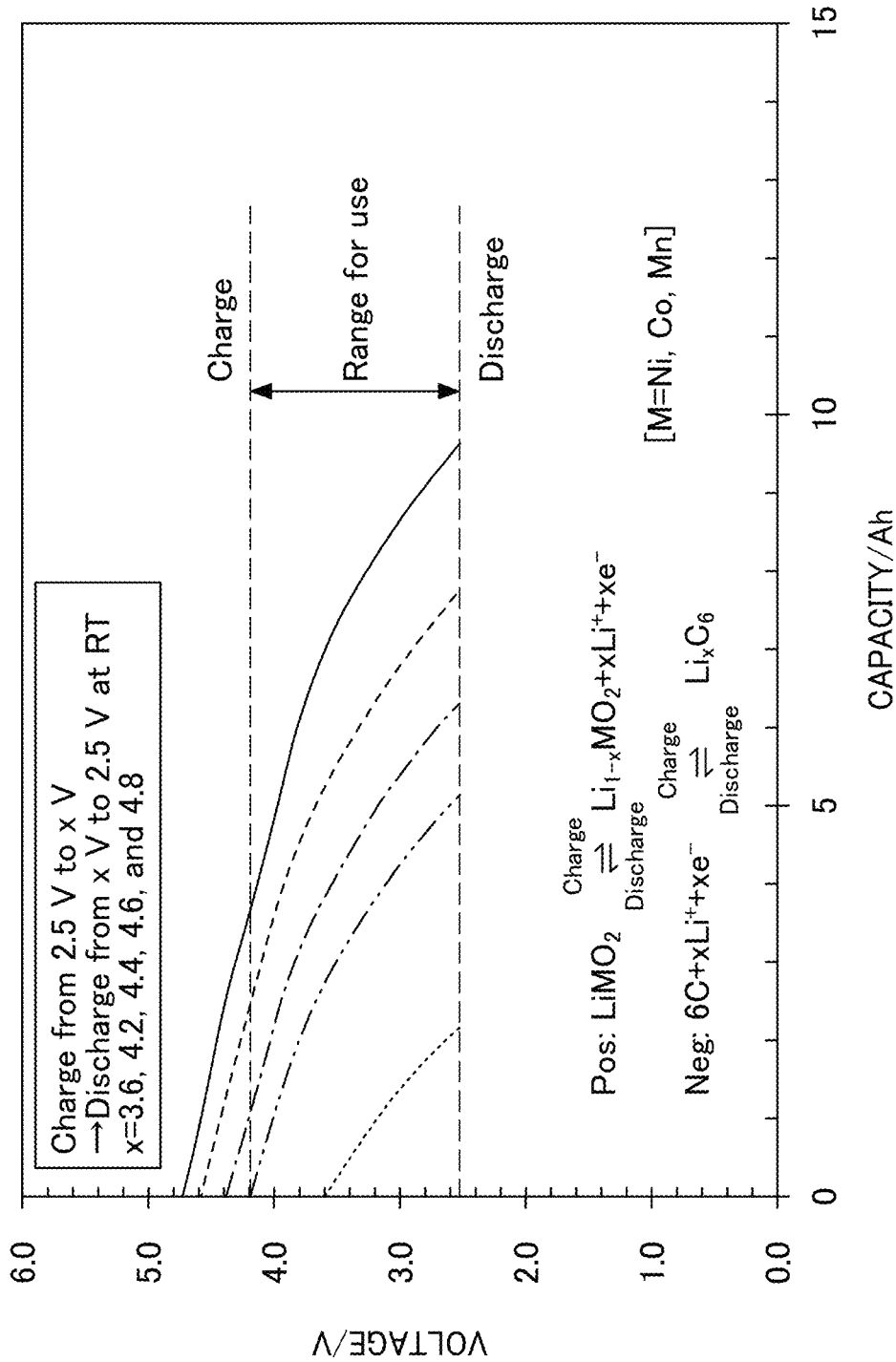
FIG. 6 illustrates a relationship between a capacity and a voltage of a lithium-ion battery.

Accordingly, the inventor has examined whether the heat generation point in an overcharge region is detectable in a voltage range for use from a relationship between a charge/discharge capacity and a battery voltage of a lithium-ion secondary battery (see FIG. 6).

In general, in a lithium-ion secondary battery, if a stoichiometric composition of Li decreases because of charging, the crystal state of $Li_{1-x}MO_2$ is no longer maintained and O is released. From this fact, it is considered that in the overcharge region, oxygen is released as a result of oxidation of the positive electrode active material $Li_{1-x}MO_2$ or oxidation of the electrolyte ($LiPF_6$ or a carbonate solvent) in oxidation (heat generation) at the positive electrode and oxidation (heat generation) occurs using the released oxygen at the negative electrode.

Figure 7:
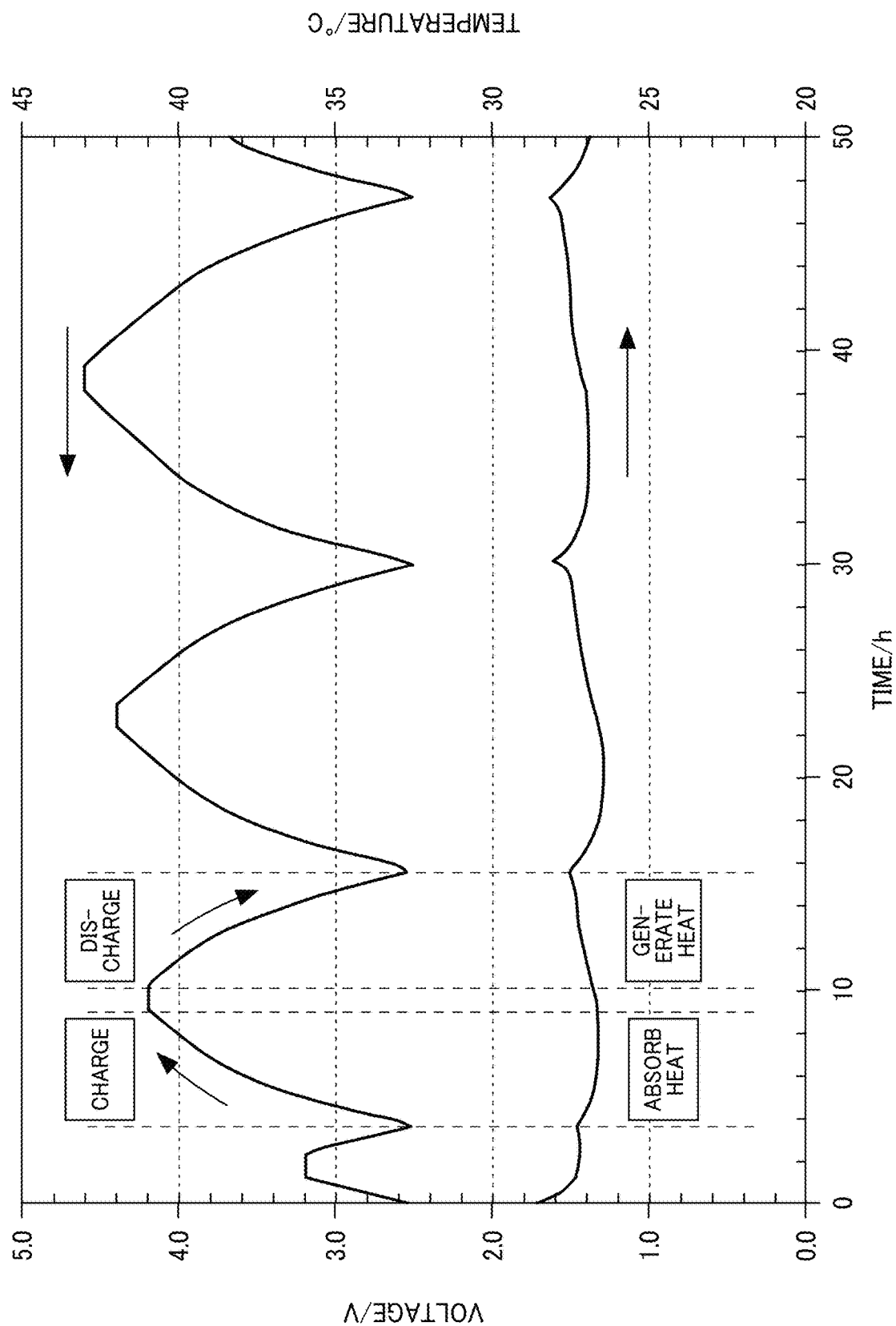
FIG. 7 illustrates a change in temperature of a lithium-ion battery during charging and discharging.

In the lithium-ion secondary battery, heat is generated by oxidation at the positive and negative electrodes, and heat is absorbed by reduction at the positive and negative electrodes. According to the total sum of the generated heat and the absorbed heat, the battery temperature increases or decreases. In the present embodiment, a lithium-ion secondary battery is used in which heat is absorbed during charging and heat is generated during discharging (see FIG. 7).

Figure 8:
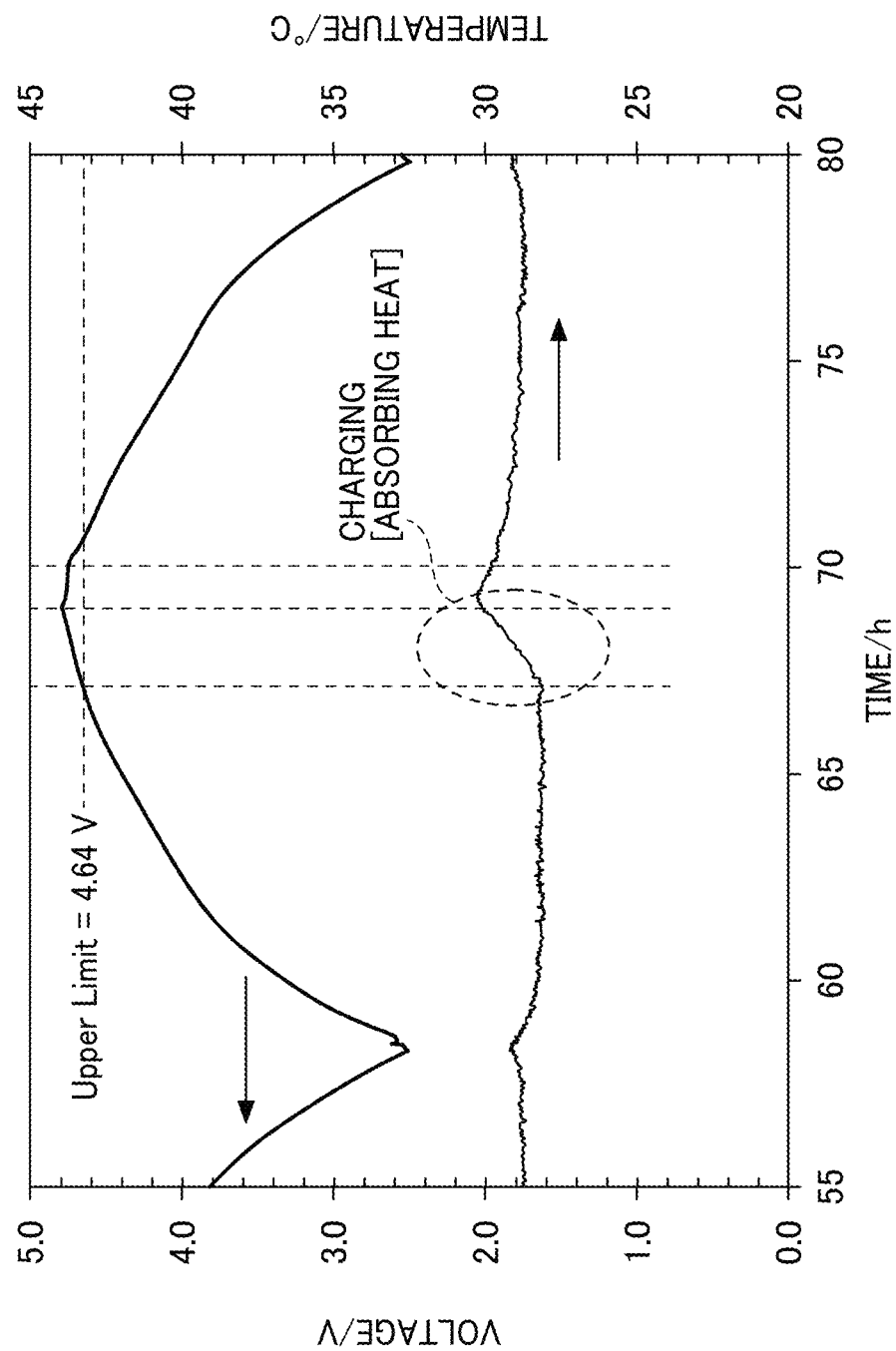
FIG. 8 illustrates a change in temperature of the lithium-ion battery during charging and discharging (4.8 V)

In the present embodiment, the lithium-ion secondary battery serving as a target is charged and discharged at 4.8 V. In this case, the battery temperature starts to increase in response to the voltage exceeding 4.64 V when the lithium-ion secondary battery is charged (heat is absorbed). This confirms the presence of oxidation other than oxidation by a charge reaction of the active material (see FIG. 8).

Figure 9:
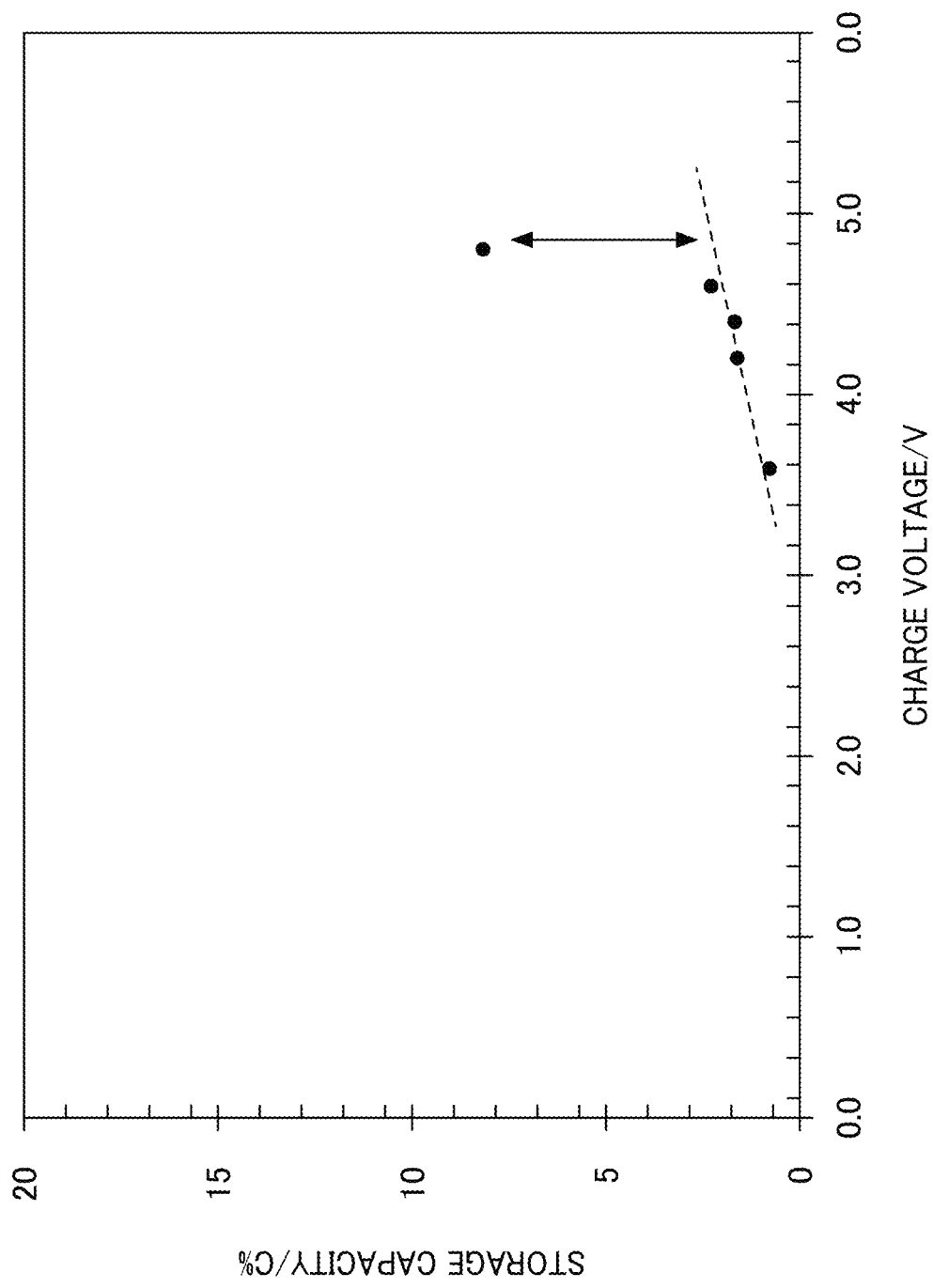
FIG. 9 illustrates a relationship between a charge voltage and an irreversible electricity quantity of the lithium-ion battery.

Expression (1) below represents a relationship between a charge voltage and an irreversible electricity quantity of the lithium-ion battery serving as the target (see FIG. 9).

$$\text{(Charge electricity quantity−Discharge electricity quantity)/Discharge electricity quantity} \times 100 \quad (1)$$

In Expression (1), "(Charge electricity quantity−Discharge electricity quantity)" depends on the amount of substance in a reaction (side reaction) that occurs other than the charge reaction, and "Discharge electricity quantity" depends on the amount of substance in the charge reaction for storing electricity. An arrow in FIG. 9 indicates that the reaction other than the charge reaction is included. This reaction is presumed to involve in the increase in the battery temperature.

Figure 10:
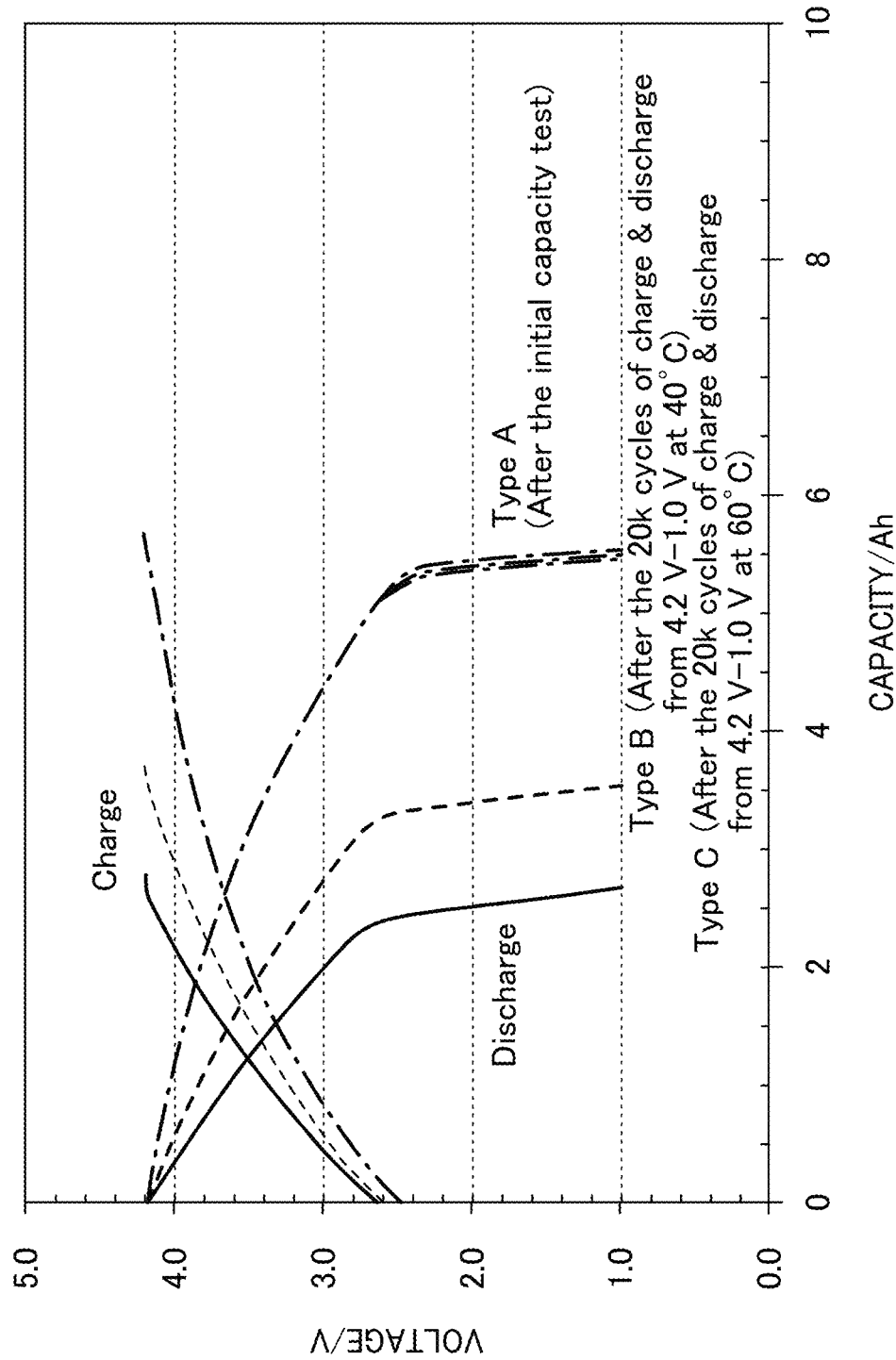
FIG. 10 illustrates a relationship between a capacity and a voltage of deteriorated lithium-ion batteries.

The inventor has confirmed that deterioration of the battery changes the voltage at which the absolute value of a rate of change in voltage starts to change greatly in a last stage of discharging (see FIG. 10). In FIG. 10, "Type A" represents an unused cell. "Type B" represents a cell deteriorated through charge and discharge in a range from 4.2 V to 1.0 V at 40° C. "Type C" represents a cell deteriorated through charge and discharge in a range from 4.2 V to 1.0 V at 60° C.

Figure 11:
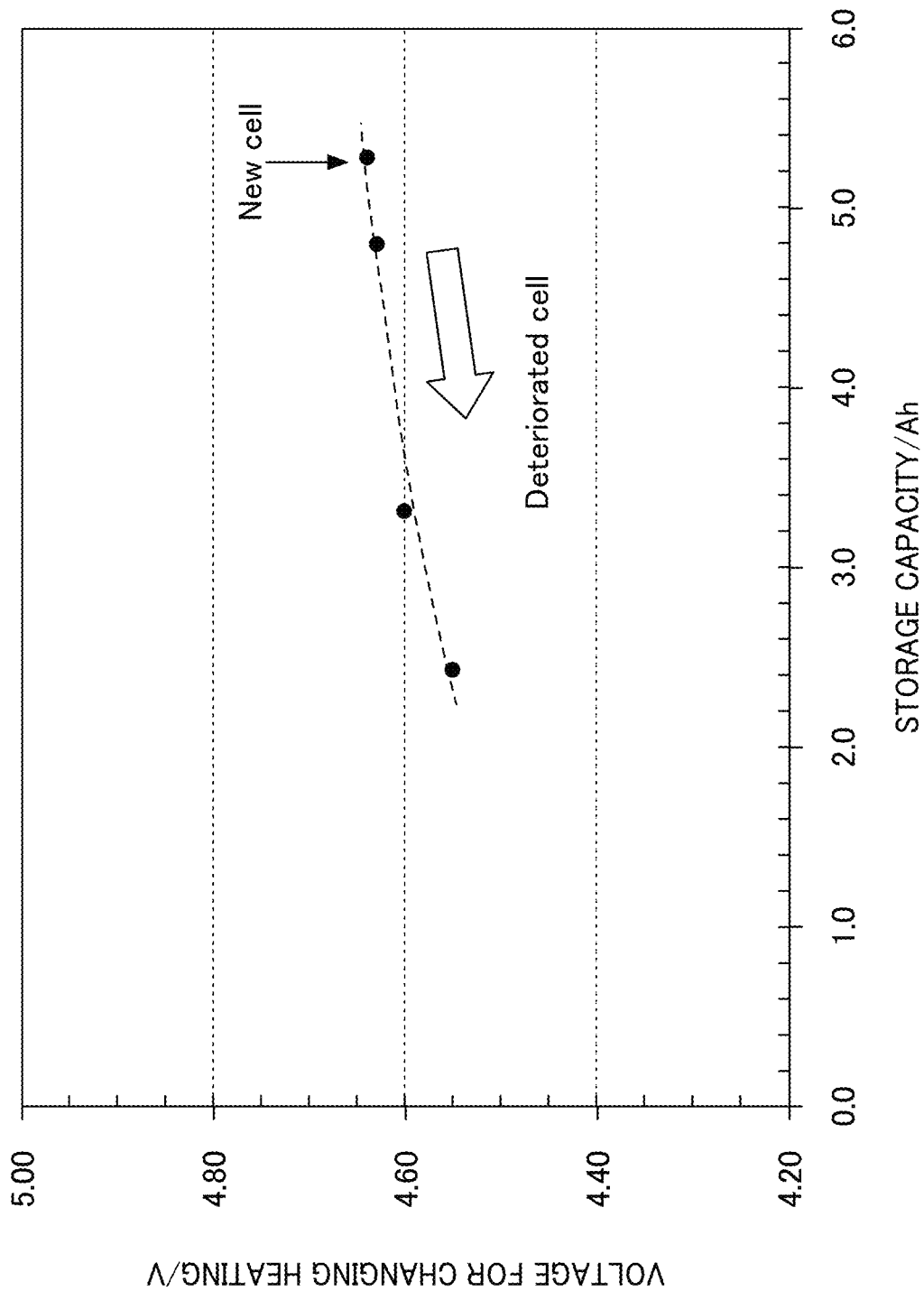
FIG. 11 illustrates a relationship between a storage electricity quantity and a voltage at which heat generation starts during charging in deteriorated lithium-ion batteries.

The inventor has also found out that a storage electricity quantity of a deteriorated battery and a voltage at which heat generation starts in the deteriorated battery during charging have a correlation (see FIG. 11). Based on this correlation, the inventor has examined whether the correlation is still present even if stress (for example, repetition of charge and discharge) that makes the battery deteriorate changes, whether the electrode potentials can be estimated because the voltage changes depending on the deterioration of the battery, and whether a safe point can be detected using a measured value in the voltage range for use.

Figure 12:
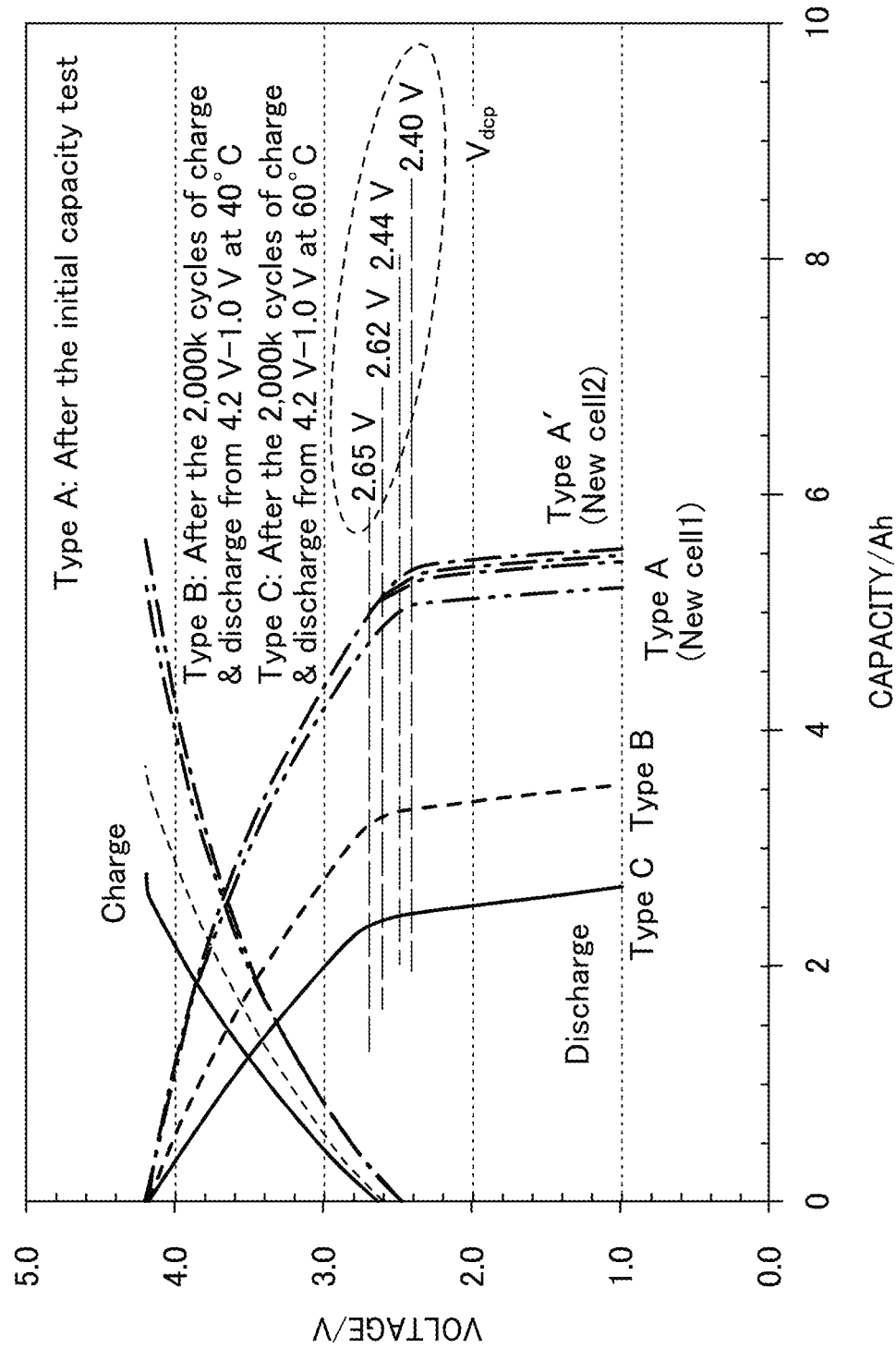
FIG. 12 illustrates charge curves and discharge curves of lithium-ion batteries having different storage electricity quantities because of deterioration.
Figure 13:
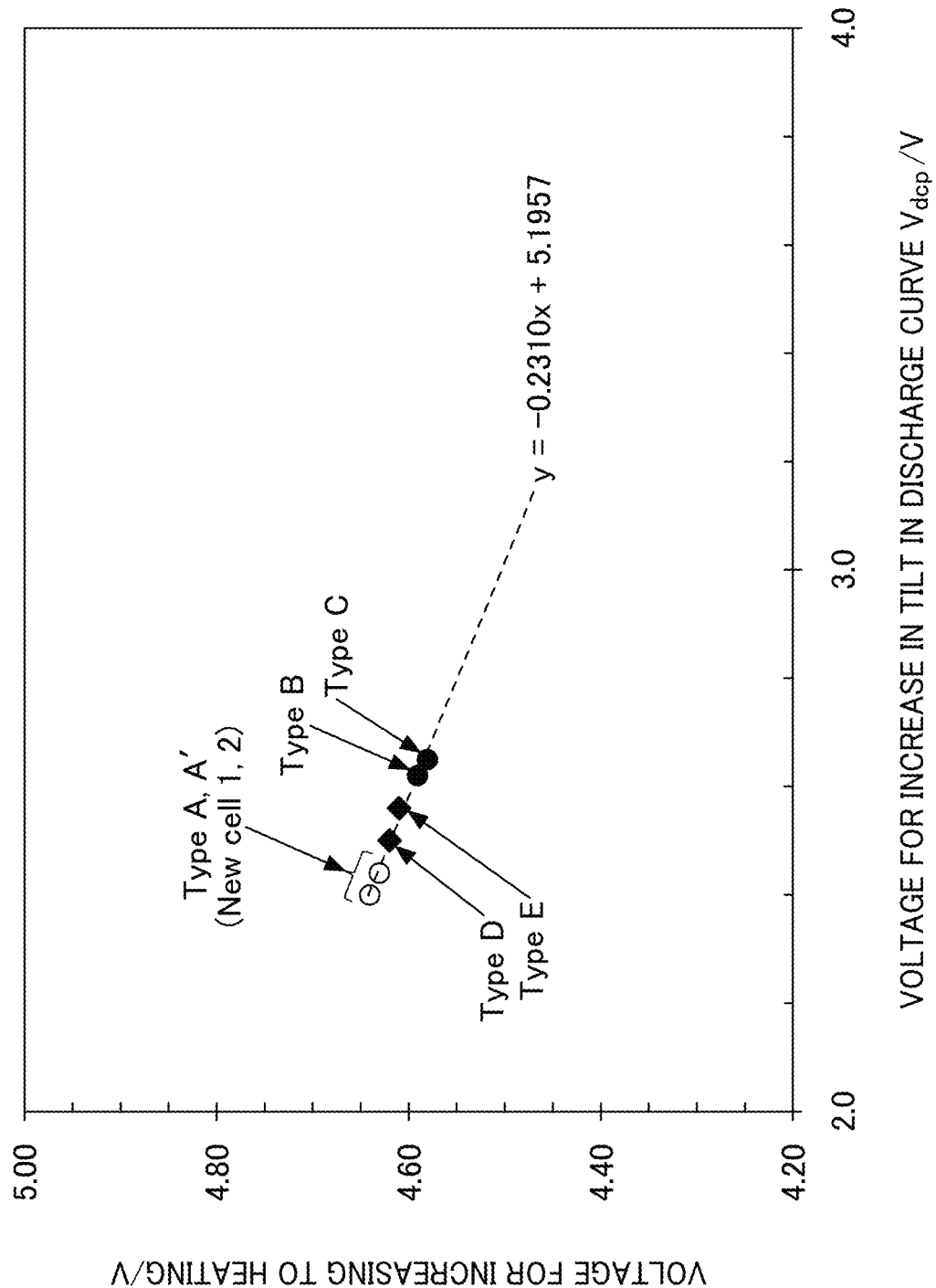
FIG. 13 illustrates a relationship between a voltage at which a slope of a discharge curve increases and a voltage at which heat generation starts.

In the present embodiment, the safe point is detected from charge-discharge curves of lithium-ion batteries that have different storage electricity quantities because of deterioration (see FIG. 12). Specifically, a correlation among the storage electricity quantity of the battery, an increase point of a first differential coefficient of the discharge curve, and an increase point of the temperature during overcharging (overcharge temperature increase point) is used to predict an unsafe state during overcharging from the discharge curve (see FIG. 13).

Figure 14:
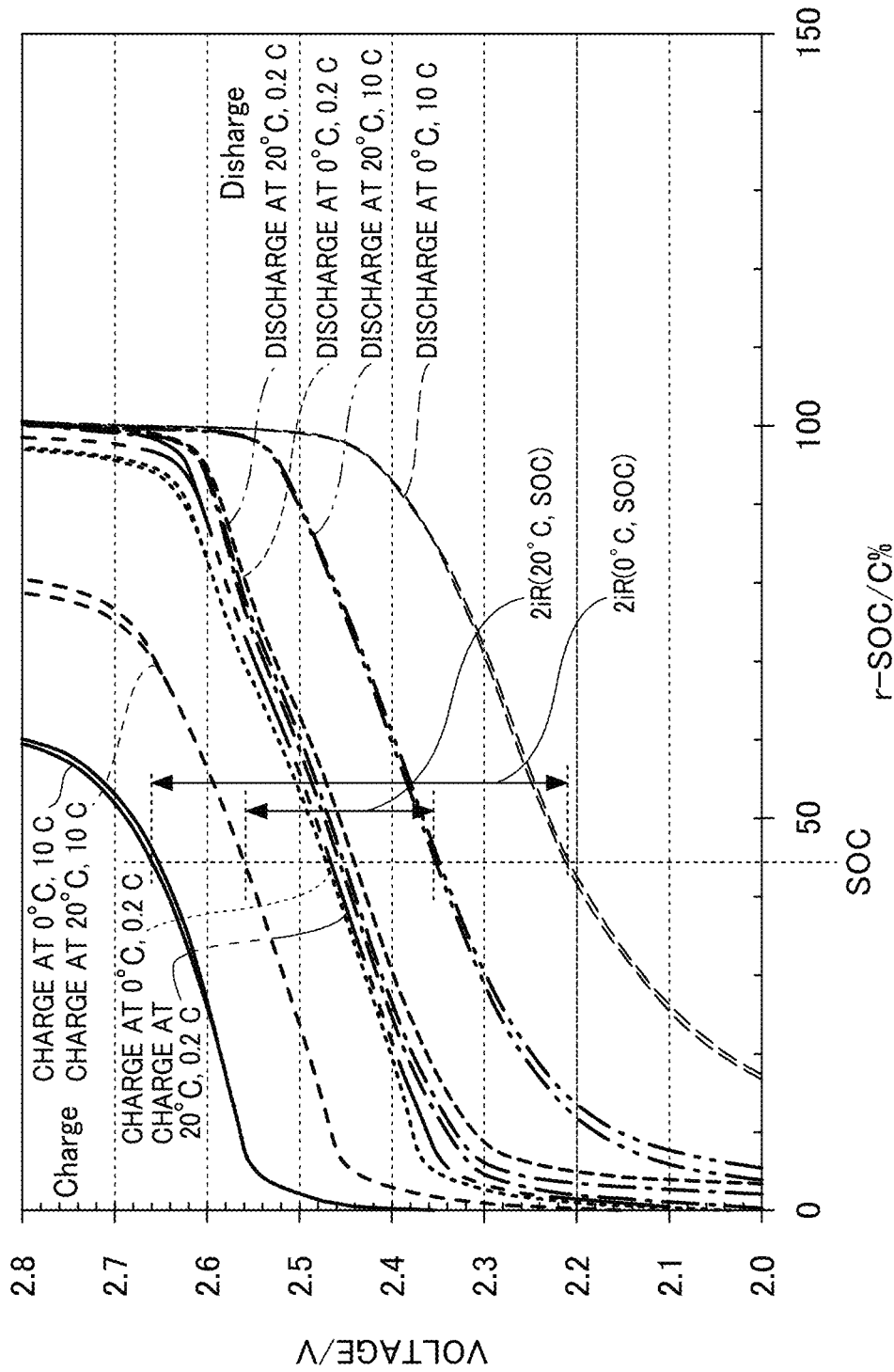
FIG. 14 illustrates charge curves and discharge curves in an environment in which an internal resistance of the lithium-ion battery changes.

In the present embodiment, charge-discharge curves are created in an environment in which the internal resistance of the lithium-ion battery changes (see FIG. 14). The measured battery voltage of the lithium-ion secondary battery is obtained from Expression (2) below.

$$[\text{(Measured) battery voltage}]=[\text{Potential difference between electrodes (from which a voltage drop is removed)}]\pm iR \quad (2)$$

(where +i denotes charging, and −i denotes discharging)

The voltage of a lithium-ion secondary battery in the case where a current i flows through the lithium-ion secondary battery having an internal resistance R drops by an amount of iR from an equilibrium potential of an electrochemical device when the current flows through an external circuit in a forward direction from a high-voltage site (positive terminal) to a low-voltage site (negative terminal) (in the case of discharging). The aforementioned voltage drop indicates such a drop. When the current flows through the external circuit in the reverse direction from the negative terminal to the positive terminal (in the case of charging), the voltage becomes overvoltage by the amount of iR.

Figure 15:
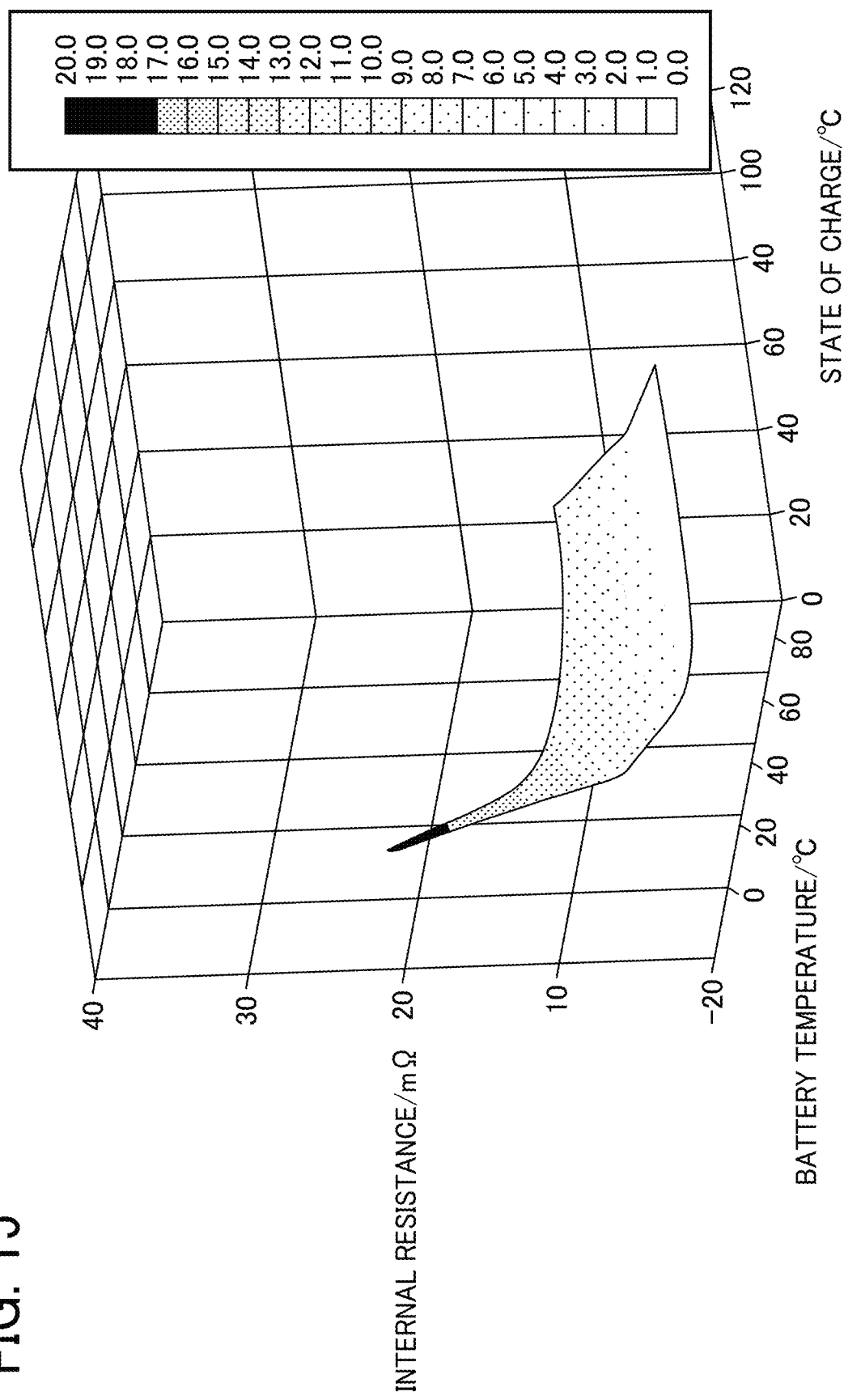
FIG. 15 illustrates a relationship among a battery temperature, a state of charge, and an internal resistance of the lithium-ion battery.
Figure 16:
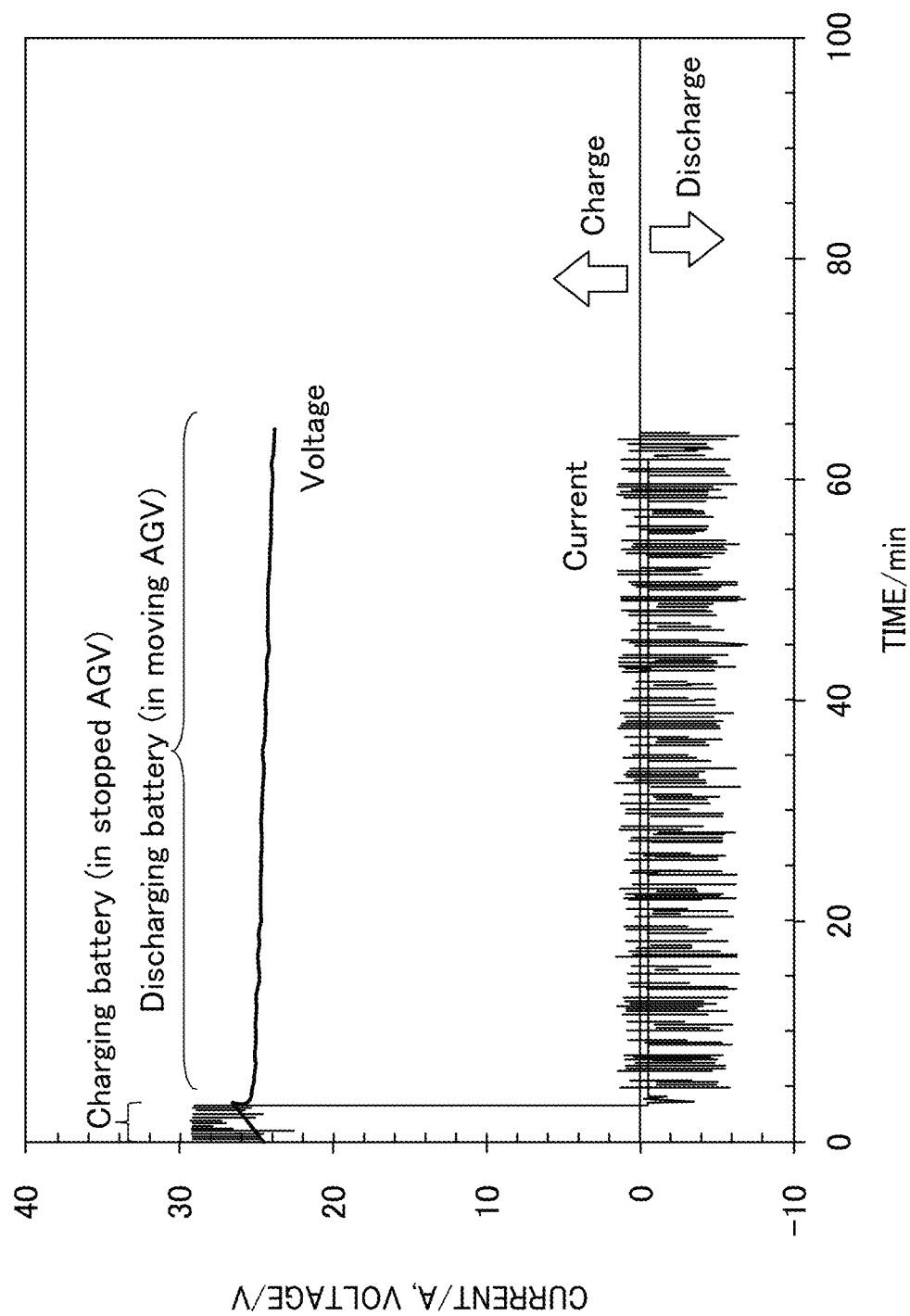
FIG. 16 illustrates a change in current flowing through the lithium-ion battery.
Figure 17:
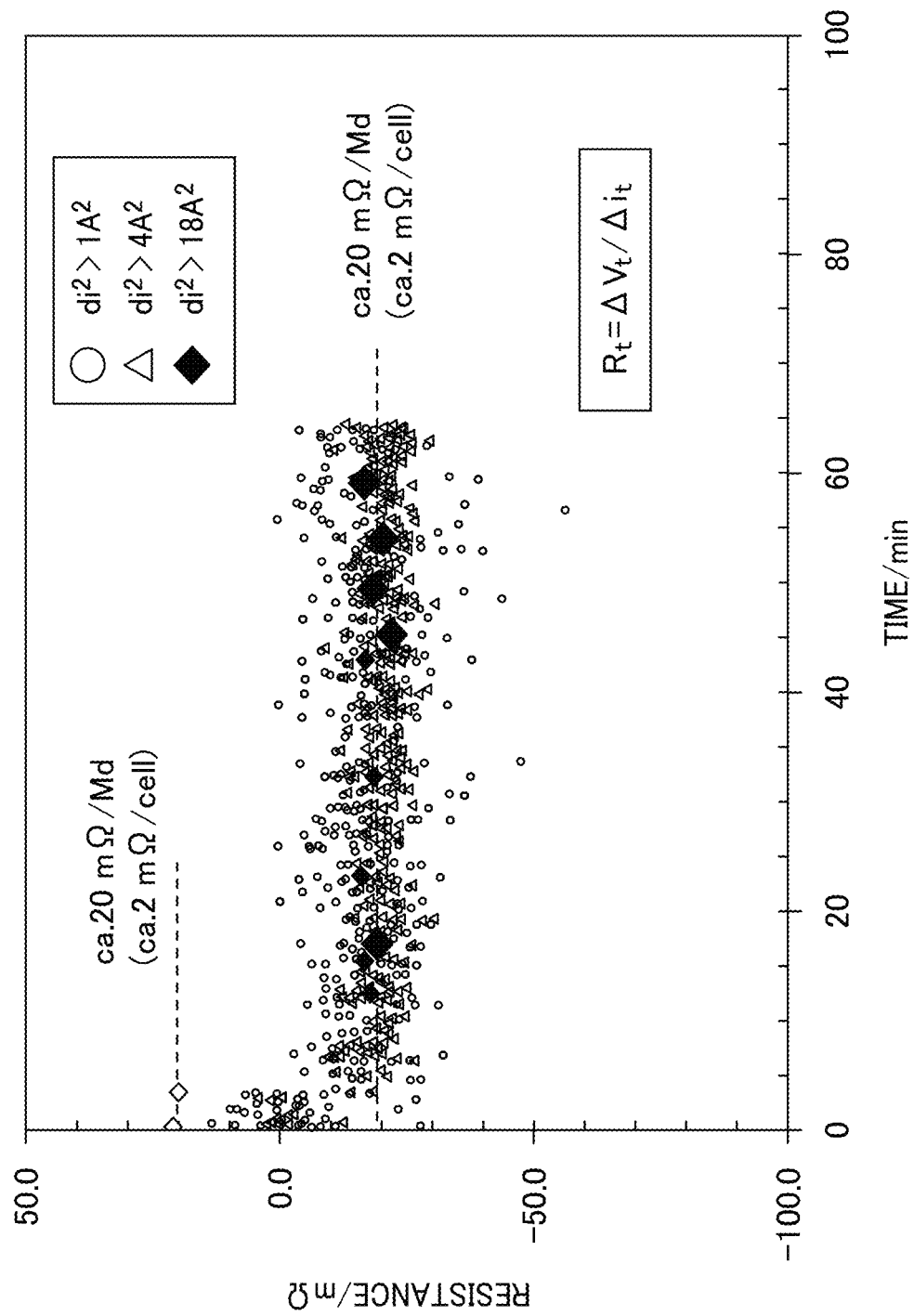
FIG. 17 illustrates a change in internal resistance of the lithium-ion battery.

FIG. 15 illustrates a relationship among the battery temperature, the state of charge, and the internal resistance of the lithium-ion battery. FIG. 16 illustrates a change in current flowing through the lithium-ion battery. FIG. 17 illustrates a change in the internal resistance of the lithium-ion battery obtained from FIGS. 15 and 16. FIG. 17 indicates that the internal resistance of the lithium-ion secondary battery rarely changes over time and becomes substantially constant when the electric capacity of the lithium-ion secondary battery is large.

The present disclosure is obtained from such knowledge and findings.

FIG. 18 is a flowchart for carrying out the method for detecting a safe state of a lithium-ion secondary battery (hereinafter, referred to as a safe state detection method) according to the present embodiment. In the safe state detection method according to the present embodiment, an absolute value of a differential coefficient of a discharge curve (discharge voltage differential coefficient) from which a voltage equivalent to a voltage drop of the lithium-ion secondary battery is removed is calculated (step S1 of FIG. 18).

The lithium-ion secondary battery used in the safe state detection method according to the present embodiment includes one cell or a series-connected assembled battery of two or more cells. The lithium-ion secondary battery according to the present embodiment may a lithium-ion secondary battery a current flowing through which changes over time, and may be a used lithium-ion secondary battery. The term "used" means that the lithium-ion secondary battery is substantially used at least once and is reusable.

The lithium-ion secondary battery is a type of a non-aqueous liquid electrolyte battery that uses, as a liquid electrolyte, an ion-conductive electrolytic solution (for example, a liquid electrolyte in which a lithium salt is dissolved) as an aprotic organic solvent.

In the present embodiment, the type of the lithium-ion secondary battery is not limited. However, a lithium-ion secondary battery which has a positive electrode with a positive electrode active material that contains a manganese-containing lithium transition-metal oxide and has a negative electrode made of a carbon material is preferably used. In this lithium-ion secondary battery, lithium ions are released and occluded at the positive electrode, and lithium ions are intercalated and released at the negative electrode, so that charging and discharging are performed.

The lithium-ion secondary battery uses, as a negative electrode active material, a carbon material that occludes and releases lithium ions, and uses, as a positive electrode active material, a lithium-containing metal oxide such as $LiCoO_2$, $LiNiO_2$, $LiMn_2O_4$, or $LiFeO_2$.

In the present embodiment, the positive electrode active material is not limited. However, the positive electrode active material preferably includes $Li_xMO_2$, where M denotes a transition metal and x<0.5 holds in response to the lithium-ion secondary battery being charged to 3.8 V.

Herein, the voltage equivalent to the voltage drop is a voltage obtained by subtracting a product of a current flowing through the lithium-ion secondary battery and an internal resistance of the lithium-ion secondary battery from a voltage of the lithium-ion secondary battery.

The discharge curve is preferably updated based on the voltage equivalent to the voltage drop in the case where a storage electricity quantity of the lithium-ion secondary battery is equal to X (Ah) and an absolute value of the current flowing through the lithium-ion secondary battery satisfies a condition of X (A) or greater, where X is a positive real number.

The absolute value of the differential coefficient of the discharge curve represents a rate of change in voltage during discharging.

Note that in the safe state detection method according to the present embodiment, before calculating the absolute value of the discharge voltage differential coefficient, a condition under which the safe state detection method is carried out and an obtained result may be displayed on a screen. The obtained absolute value of the discharge voltage differential coefficient may be stored in a memory to be input and output.

In the safe state detection method according to the present embodiment, a first battery voltage at a start of a sharp increase in the absolute value of the differential coefficient (that is, when the degree of increase in absolute value of the discharge voltage different coefficient is greater than a threshold value) is determined. Specifically, it is determined whether the degree of increase in absolute value of the discharge voltage differential coefficient calculated in step S1 is greater than a predetermined threshold value (step S2 in FIG. 18).

If it is determined that the degree of increase in absolute value of the discharge voltage differential coefficient is greater than the predetermined threshold value, the first battery voltage at the start of the sharp increase in the absolute value of the differential coefficient (that is, when the degree of increase in absolute value of the discharge voltage different coefficient is greater than a threshold value) is determined. Specifically, a discharging differential coefficient increase voltage $V_{dcp}$ is determined as the first battery voltage (step S3 in FIG. 18). The discharging differential coefficient increase voltage $V_{dcp}$ corresponds to the above-described increase point of the first differential coefficient of the discharge curve.

The absolute value of the differential coefficient at the start of the sharp increase is greater than or equal to preferably 1.5 times, more preferably 1.8 times, and still more preferably 2.0 times the absolute value of the differential coefficient immediately before the start of the sharp increase.

For example, when a time period from a time when the lithium-ion secondary battery is fully charged to a time when electricity in the battery becomes empty after being discharged, is set to 100, that time period is divided into 100 units of time for sampling. Then, the absolute value of the discharge voltage differential coefficient for the n-th unit of time, and the absolute value of the discharge value differential coefficient for the n+1-th unit of time, are compared. When the absolute value of the discharge value differential coefficient for the n+1-th unit of time increases by 1.5 times (preferably 1.8 times, more preferably 2.0 times), than the absolute value of the discharge value differential coefficient for the n-th unit of time, it is determined that there is a sharp increase.

That is, the degree of increase in the absolute value of the discharge value differential coefficient, is the degree of increase from the absolute value of the discharge value differential coefficient calculated at S1, to the absolute value of the discharge value differential coefficient that is calculated immediately before S1. For example, such degree of increase may be expressed in terms of a ratio of the absolute value of the discharge value differential coefficient calculated at S1, to the absolute value of the discharge value differential coefficient that is calculated immediately before S1. Further, a threshold for determining whether the degree of increase is sharp for the absolute value of the discharge value differential coefficient, is set to 1.5 times, and preferably set to 1.8 times, and more preferably set to 2.0 times.

If it is determined in step S2 that the absolute value of the discharge voltage differential coefficient is less than or equal to the predetermined threshold value, the process returns to step S1.

A second battery voltage at a start of an increase of oxidation heat, generated inside the lithium-ion secondary battery when the lithium-ion secondary battery is overcharged, in response to the first battery voltage determined in step S3 is determined. Specifically, an unsafe sign point $V_{USP}$ is calculated as the second battery voltage (step S4 in FIG. 18). The unsafe sign point $V_{USP}$ corresponds to the above-described overcharge temperature increase point (heat generation point in the overcharge region).

The first battery voltage (discharging differential coefficient increase voltage $V_{dcp}$) is substituted into, for example, a model expression represented by Expression (3) below to estimate the second battery voltage (unsafe sign point $V_{USP}$).

$$V_{USP} = -0.2310 V_{dcp} + 5.1957 \quad (3)$$

The approximation expression representing the unsafe sign point $V_{USP}$ varies depending on the type and design of the lithium-ion battery. The approximation expression is defined through investigation of a voltage at which heat absorption changes to heat generation during overcharging and a voltage at which the absolute value of the rate of change in voltage starts to change greatly in the last stage of discharging for cells with different degrees of deterioration in a certain lithium-ion battery.

A safe state of the lithium-ion secondary battery is detected, based on the second battery voltage (unsafe sign point $V_{USP}$) obtained in step S4. Specifically, a safe level of the lithium-ion secondary battery is calculated, and the safe level of the lithium-ion secondary battery is rated as a rank A, B, or C (step S5 in FIG. 18).

Thresholds for the respective ranks are as follows. For example, for the rank A, a condition $[V_{USP} > \beta_A \ (\beta_A = 4.60 \text{ V})]$, which indicates "the battery is currently safe", is used. For the rank B, a condition $[\beta_A > V_{USP} > \beta_B \ (\beta_B = 4.57 \text{ V})]$, which indicates "the battery possibly becomes unsafe in the near future", is used. For the rank C, a condition $[\beta_B > V_{USP} > \beta_C \ (\beta_C = 4.55 \text{ V})]$, which indicates that "the occurrence of an unsafe incident is highly likely, and stop using the battery and replacement of the battery are strongly recommended", is used. With such thresholds, the rank is determined (step S6 in FIG. 18).

If the determined rank is the rank A in step S6, the process returns to step S1, in which the absolute value of the discharge voltage differential coefficient is calculated. If the determined rank is the rank B, the process proceeds to step S7. In step S7, the lithium-ion secondary battery is determined to be at an "unsafe sign level". The process then returns to step S1, in which the absolute value of the discharge voltage differential coefficient is calculated. If the determined rank is the rank C, the process proceeds to step S8. In step S8, the lithium-ion secondary battery is determined to be at a "continuous use prohibited level", and execution of the safe state detection method ends.

Note that in the safe state detection method according to the present embodiment, the obtained absolute value of the discharge voltage differential coefficient, the first battery voltage (discharging differential coefficient increase voltage $V_{dcp}$), the second battery voltage (unsafe sign point $V_{USP}$), the threshold values used in rank rating, and the determined result of the safe level may be displayed on a screen.

The obtained absolute value of the discharge voltage differential coefficient, the first battery voltage (discharging differential coefficient increase voltage $V_{dcp}$), the second battery voltage (unsafe sign point $V_{USP}$), the threshold values used in rank rating, and the determined result of the safe level may be stored in a memory to be input and output.

The storable electricity quantity of the lithium-ion secondary battery is predictable based on the first battery voltage. For example, the higher the first battery voltage (discharging differential coefficient increase voltage $V_{dcp}$), the larger the discharge capacity of the lithium-ion secondary battery.

The safe state detection method according to the present embodiment may be controlled by a computer that includes, for example, a central processing unit (CPU), a storage device, and an input interface such as a keyboard that receives signals from an external device.

As described above, in the safe state detection method according to the present embodiment, the first battery voltage at the start of the sharp increase in the absolute value of the differential coefficient of the discharge curve, from which the voltage equivalent to the voltage drop of the lithium-ion secondary battery is removed, is determined. The second battery voltage at the start of the increase in oxidation heat, generated inside the lithium-ion secondary battery when the lithium-ion secondary battery is overcharged, in response to the first battery voltage is determined. The safe state of the lithium-ion secondary battery is detected based on this determined second battery voltage.

This enables the heat generation point at which the internal state of the battery transitions from the heat absorbing state to the heat generating state when the lithium-ion secondary battery is overcharged in the voltage range for use to be detected as a safe point that depends on deterioration of the lithium-ion secondary battery. Thus, the present embodiment enables a sign of the unsafe state of the lithium-ion secondary battery in use to be detected, and thus enables a replacement timing or the like of the lithium-ion secondary battery to be predicted.

As described above, in the safe state detection method according to the present embodiment, the absolute value of the differential coefficient at the start of the sharp increase is greater than or equal to 1.5 times the absolute value of the differential coefficient immediately before the start of the sharp increase. This enables the heat generation point to be accurately detected when the lithium-ion secondary battery is overcharged. Thus, the present embodiment enables the sign of the unsafe state of the lithium-ion secondary battery to be detected with a high accuracy.

As described above, in the safe state detection method according to the present embodiment, the voltage equivalent to the voltage drop is a voltage obtained by subtracting a product of a current flowing through the lithium-ion secondary battery and an internal resistance of the lithium-ion secondary battery from a voltage of the lithium-ion secondary battery. This enables the heat generation point to be detected during overcharging even for the lithium-ion secondary battery in use. Thus, the present embodiment enables the sign of the unsafe state of the lithium-ion secondary battery to be detected with a high accuracy.

As described above, in the safe state detection method according to the present embodiment, the discharge curve is updated based on the voltage equivalent to the voltage drop in the case where the storage electricity quantity of the lithium-ion secondary battery is equal to X (Ah) and the absolute value of the current flowing through the lithium-ion secondary battery satisfies a condition of X (A) or greater, where X is a positive real number. This enables the discharge curve from which the heat generation point is detected to be created again in accordance with conditions such as the number of cells, the discharge capacity, and the deterioration state of the lithium-ion secondary battery.

As described above, in the safe state detection method according to the present embodiment, a storable electricity quantity of the lithium-ion secondary battery is predicted based on the first battery voltage. This enables the current battery performance as well as the sign of the unsafe state of the lithium-ion secondary battery in use to be grasped.

As described above, in the safe state detection method according to the present embodiment, the positive electrode active material includes $Li_xMO_2$, where M denotes a transition metal and $x<0.5$ holds in response to the lithium-ion secondary battery being charged to 3.8 V. This makes the discharge curve from which the heat generation point is detected smooth (makes the discharge curve unlikely to have multiple steps), and thus enables the absolute value of the differential coefficient of the discharge curve to be calculated accurately.

As described above, the safe state detection method according to the present embodiment enables the sign of the unsafe state to be detected at the start of use even if the lithium-ion secondary battery is a used lithium-ion secondary battery, and thus enables recycling of the used lithium-ion secondary battery. From this viewpoint, the present embodiment may contribute to construction of a decarbonized society or a recycling-oriented society and to achieving carbon-neutral and sustainable development goals (SDGs).

With the use of the advantageous effects described above, the safe state detection method according to the present embodiment is usable in various power supplies. That is, the safe state of a lithium-ion secondary battery included in a power supply is detectable with the safe state detection method according to the present embodiment. Thus, a sign of the unsafe state of the lithium-ion secondary battery included in the power supply in use is detectable, and the replacement timing or the like of the lithium-ion secondary battery in the power supply is predictable.

A power supply including a lithium-ion secondary battery subjected to the safe state detection method according to the present embodiment is usable in various applications. Examples of the applications of the power supply include a drive apparatus and a power control apparatus.

Examples of the drive apparatus include, but not limited to, a vehicle such as a hybrid automobile or an electric automobile, and an ascending-descending apparatus such as an elevator apparatus.

When the drive apparatus is a vehicle, for example, a power supply including a lithium-ion secondary battery subjected to the safe state detection method according to the present embodiment is installed in, for example, a hybrid automobile that is driven by an internal combustion engine and a motor. The installed power supply may function as a power supply for starting the engine, restarting the engine after idling stop, supplying power during acceleration, and regenerating power during breaking in the hybrid automobile.

The hybrid automobile is an example of the drive apparatus that uses the power supply including the lithium-ion secondary battery subjected to the safe state detection method according to the present embodiment.

When the drive apparatus is an ascending-descending apparatus, a power supply including a lithium-ion secondary battery subjected to the safe state detection method according to the present embodiment is installed in, for example, an elevator apparatus. The installed power supply may function as a power supply for reducing a fluctuation in power caused when energy consumption and energy generation are switched due to an up-down motion and a weight on board the elevator apparatus.

The elevator apparatus is another example of the drive apparatus that uses the power supply including the lithium-ion secondary battery subjected to the safe state detection method according to the present embodiment.

The present embodiment enables a sign of the unsafe state of the lithium-ion secondary battery in use to be detected even w % ben the lithium-ion secondary battery is included in a power supply used in a drive apparatus. Thus, the replacement timing or the like of the lithium-ion secondary battery in the power supply is predictable.

In the case of the power control apparatus, a power supply including a lithium-ion secondary battery subjected to the safe state detection method according to the present embodiment is installed in, for example, a power balance adjusting apparatus. The installed power supply may function as a power supply for reducing a fluctuation of a system power or a power supply for reducing a fluctuation of a difference between power consumed and power generated using renewable energy such as solar photovoltaic power generation or wind power generation in the power balance adjusting apparatus.

The power balance adjusting apparatus is an example of the power control apparatus that uses the power supply including the lithium-ion secondary battery subjected to the safe state detection method according to the present embodiment. The present embodiment enables a sign of the unsafe state of the lithium-ion secondary battery in use to be detected even if the lithium-ion secondary battery is included in the power supply used in the power balance adjusting apparatus. Thus, the replacement timing or the like of the lithium-ion secondary battery in the power supply is predictable.

A safe state detection apparatus 13, a safe state detection system 1, and a power storage device 20 that carry out the above-described safe state detection method for a lithium-ion secondary battery will be described below.

Safe State Detection Apparatus and Safe State Detection System

Figure 19:
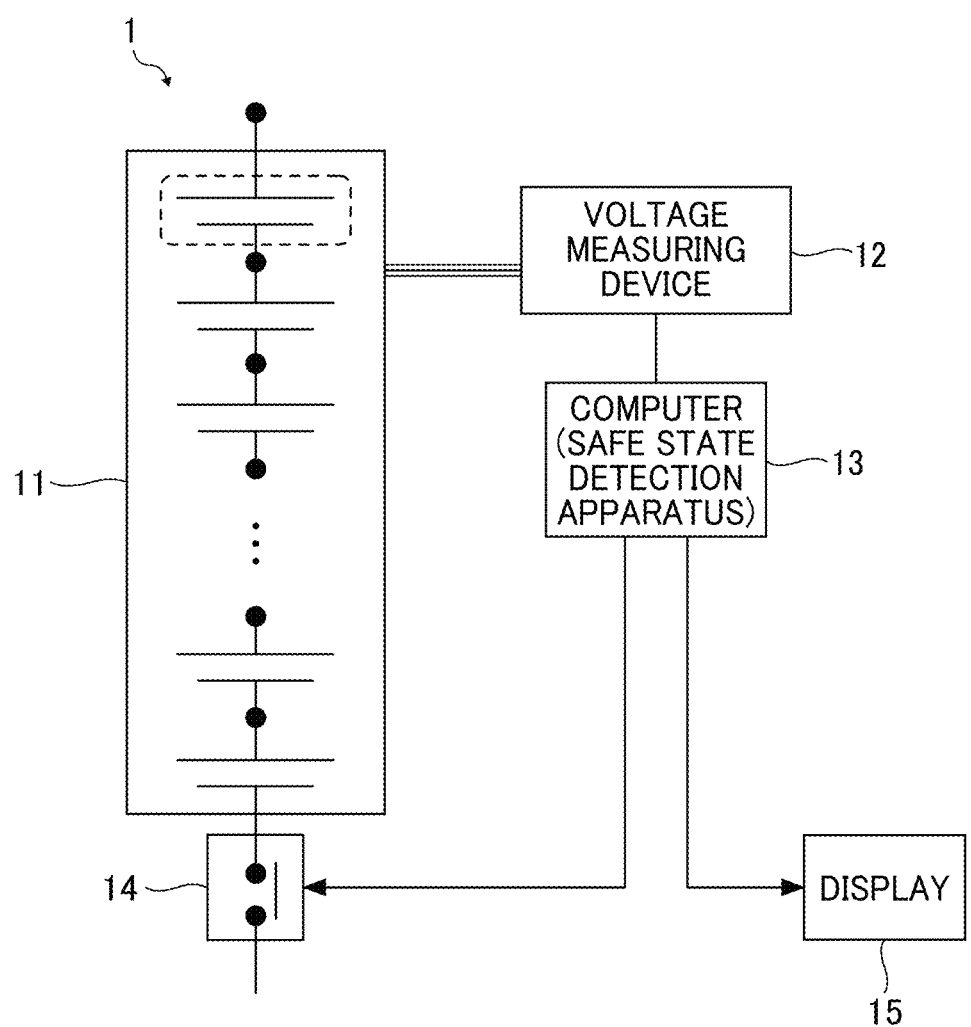
FIG. 19 illustrates an example of a safe state detection system according to one embodiment of the present disclosure.

FIG. 19 illustrates an example of the safe state detection system 1 according to one embodiment of the present disclosure. The safe state detection system 1 includes a lithium-ion secondary battery 11, a voltage measuring device 12, the computer (safe state detection apparatus) 13, a secondary battery control device (switch) 14, and a display 15. Each of these components will be described below.

The lithium-ion secondary battery 11 is a detection target, that is, a lithium-ion secondary battery whose safe state is to be detected.

The voltage measuring device 12 measures a voltage of the lithium-ion secondary battery 11.

The computer (safe state detection apparatus) 13 carries out the above-described safe state detection method for a lithium-ion secondary battery. The computer (safe state detection apparatus) 13 may include one or more computers. The computer (safe state detection apparatus) 13 may be implemented by an integrated circuit.

The secondary battery control device (switch) 14 controls the lithium-ion secondary battery 11.

The display 15 is a device that displays the safe state or the like of the lithium-ion secondary battery 11. Note that the computer (safe state detection apparatus) 13 may include the function of the display 15.

Power Storage Device

Figure 20:
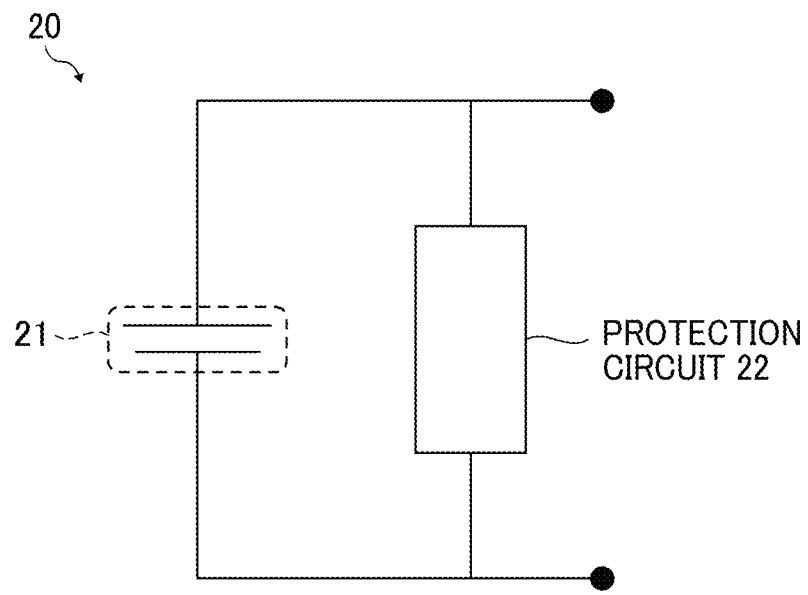
FIG. 20 illustrates an example of a power storage device according to one embodiment of the present disclosure.

FIG. 20 illustrates an example of the power storage device 20 according to one embodiment of the present disclosure. The power storage device (also referred to as a battery pack) 20 includes a lithium-ion secondary battery 21 and a protection circuit 22. Each of these components will be described below.

The lithium-ion secondary battery 21 is a detection target, that is, a lithium-ion secondary battery whose safe state is to be detected.

The protection circuit 22 is a circuit implemented for the lithium-ion secondary battery 21 and carries out the above-described safe state detection method for a lithium-ion secondary battery.

An example of using, as a power supply, the above-described lithium-ion secondary battery whose safe state is to be detected will be described below.

Figure 21:
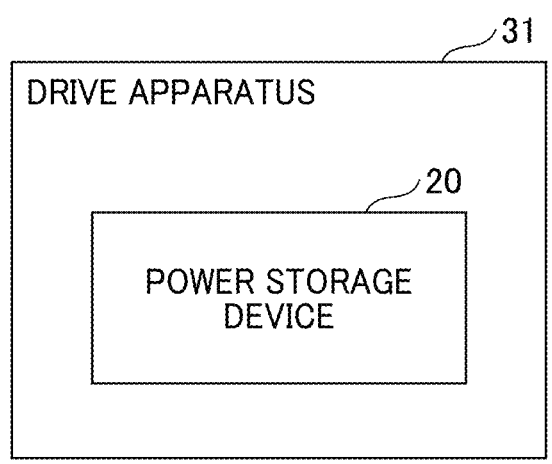
FIG. 21 illustrates an example of an application of the lithium-ion secondary battery according to the one embodiment of the present disclosure.

FIG. 21 is an example of an application of the lithium-ion secondary battery according to the one embodiment of the present disclosure. For example, a drive apparatus 31 (for example, an automobile such as a hybrid automobile or an electric automobile, an electric train, or an elevator) includes the power storage device 20 that carries out the above-described safe state detection method for a lithium-ion secondary battery.

Figure 22:
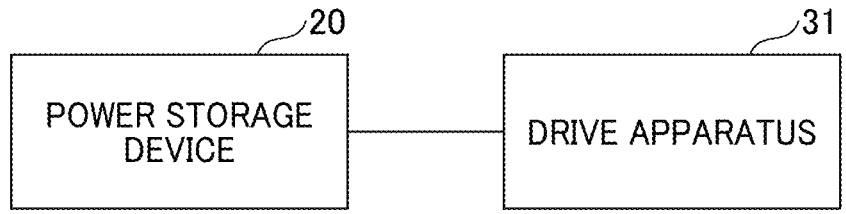
FIG. 22 illustrates an example of an application of the lithium-ion secondary battery according to the one embodiment of the present disclosure.

FIG. 22 is an example of an application of the lithium-ion secondary battery according to the one embodiment of the present disclosure. As illustrated in FIG. 22, the drive apparatus 31 and the power storage device 20 may be implemented by different devices.

Figure 23:
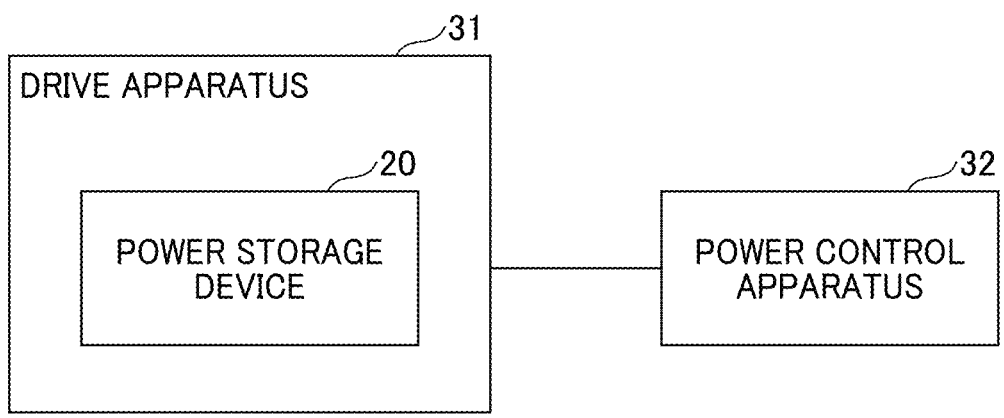
FIG. 23 illustrates an example of an application of the lithium-ion secondary battery according to the one embodiment of the present disclosure.

FIG. 23 is an example of an application of the lithium-ion secondary battery according to the one embodiment of the present disclosure. For example, the drive apparatus 31 including the power storage device 20 that carries out the above-described safe state detection method for a lithium-ion secondary battery is controlled by a power control apparatus (for example, a controller that controls an elevator) 32.

Figure 24:
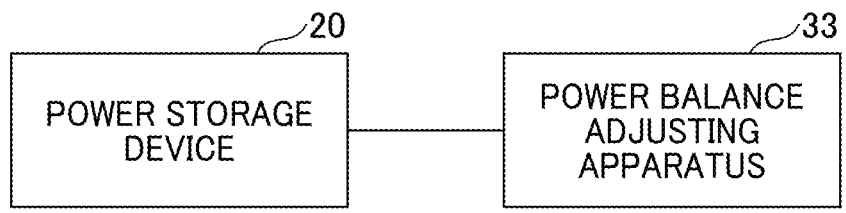
FIG. 24 illustrates an example of an application of the lithium-ion secondary battery according to the one embodiment of the present disclosure.

FIG. 24 is an example of an application of the lithium-ion secondary battery according to the one embodiment of the present disclosure. For example, a power balance adjusting apparatus 33 uses the power storage device 20 that carries out the above-described safe state detection method for a lithium-ion secondary battery, as a power supply for reducing a fluctuation of a system power or a power supply for reducing a fluctuation of a difference between power consumed and power generated using renewable energy such as solar photovoltaic power generation or wind power generation.

Hardware Configuration

Figure 25:
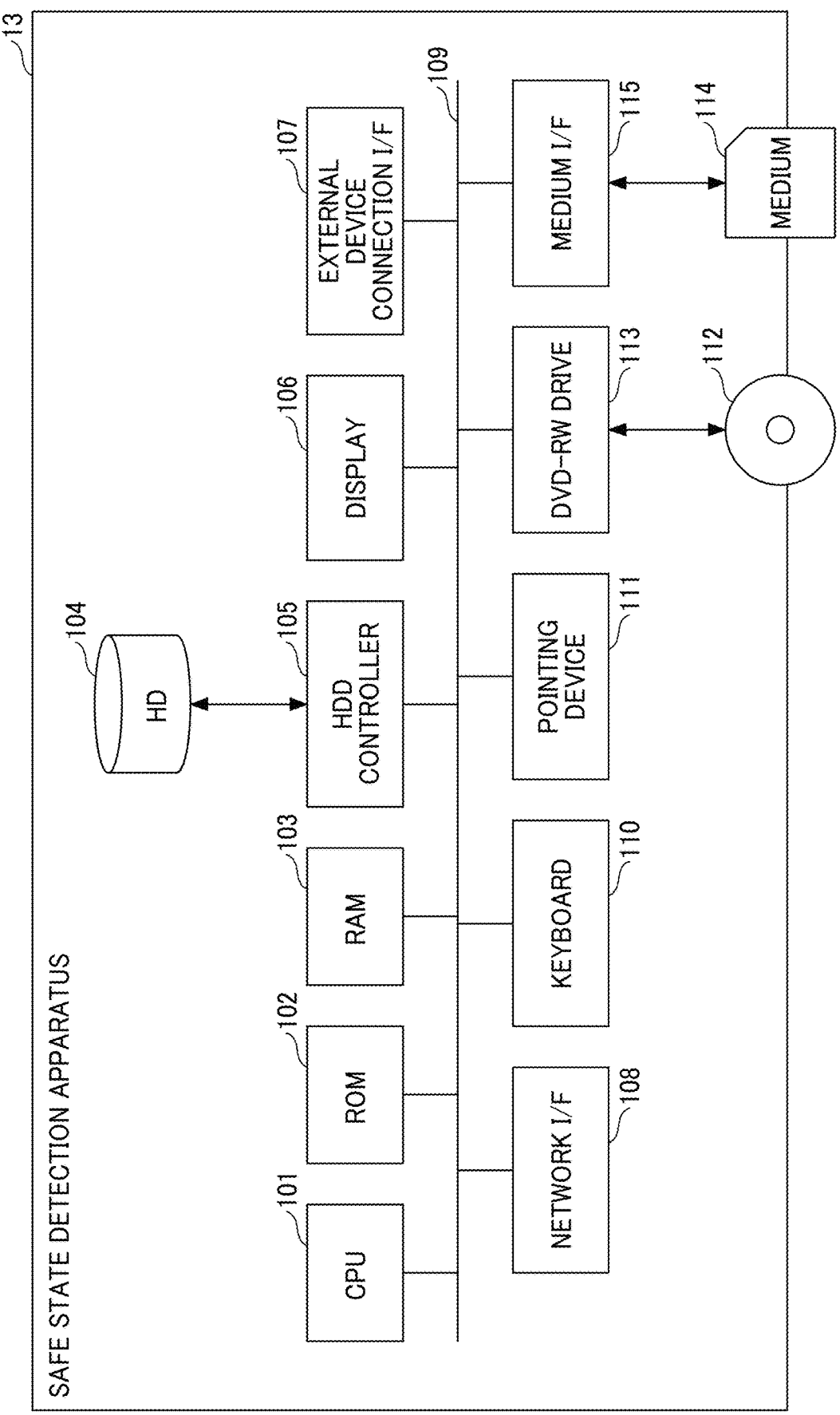
FIG. 25 illustrates an example of a hardware configuration of a safe state detection apparatus according to one embodiment of the present disclosure.

FIG. 25 illustrates an example of a hardware configuration the safe state detection apparatus 13 according to one embodiment of the present disclosure.

As illustrated in FIG. 25, the safe state detection apparatus 13 is implemented by a computer. As illustrated in FIG. 25, the safe state detection apparatus 13 includes a CPU 101, a read-only memory (ROM) 102, a random access memory (RAM) 103, a hard disk (HD) 104, a hard disk drive (HDD) controller 105, a display 106, an external device connection interface (I/F) 107, a network I/F 108, a data bus 109, a keyboard 110, a pointing device 111, a digital versatile disk rewritable (DVD-RW) drive 113, and a medium I/F 115.

The CPU 101 controls operations of the entire safe state detection apparatus 13. The ROM 102 stores a program, such as an initial program loader (IPL), used for driving the CPU 101. The RAM 103 is used as a work area of the CPU 101. The HD 104 stores various kinds of data such as the program. The HDD controller 105 controls reading of various kinds of data from or writing of various kinds of data to the HD 104 under control of the CPU 101. The display 106 displays various kinds of information such as a cursor, a menu, a window, a text, or an image. The external device connection I/F 107 is an interface for connecting various external devices. Examples of the external devices include, but not limited to, a Universal Serial Bus (USB) memory and a printer. The network I/F 108 is an interface for performing data communication via a communication network. The bus line 109 is an address bus, a data bus, or the like that electrically connects the components such as the CPU 101 illustrated in FIG. 25 to one another.

The keyboard 110 is an example of an input device including a plurality of keys with which a user inputs characters, numerals, or various instructions. The pointing device 111 is an example of an input device with which the user selects or executes various instructions, selects a processing target, or moves a cursor. The DVD-RW drive 113 controls reading of various kinds of data from or writing of various kinds of data to a DVD-RW 112, which is an example of a removable recording medium. The removable storage medium is not limited to the DVD-RW 112 and may be a digital versatile disc-recordable (DVD-R) or the like. The medium I/F 115 controls reading of various kinds of data from or writing (storing) of various kinds of data to a recording medium 114 such as a flash memory.

Functional Configuration

Figure 26:
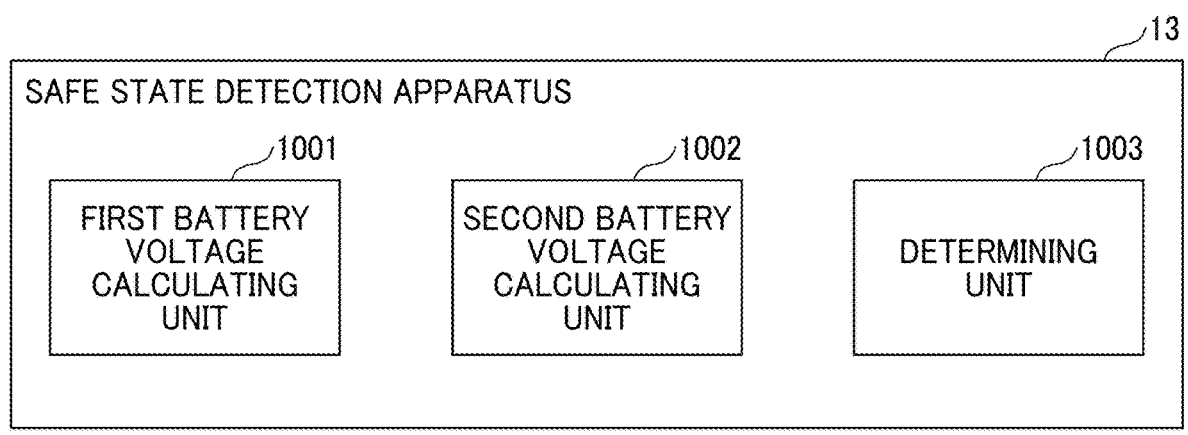
FIG. 26 illustrates an example of a functional configuration of the safe state detection apparatus according to one embodiment of the present disclosure.

FIG. 26 illustrates an example of a functional configuration of the safe state detection apparatus 13 according to the one embodiment of the present disclosure. The safe state detection apparatus 13 includes a first battery voltage calculating unit 1001, a second battery voltage calculating unit 1002, and a determining unit 1003. The safe state detection apparatus 13 may execute a program to function as the first battery voltage calculating unit 1001, the second battery voltage calculating unit 1002, and the determining unit 1003. Each of these components will be described below.

The first battery voltage calculating unit 1001 calculates the first battery voltage (discharging differential coefficient increase voltage $V_{dcp}$).

Specifically, the first battery voltage calculating unit 1001 calculates an absolute value of a differential coefficient of a discharge curve (discharge voltage differential coefficient) from which a voltage equivalent to a voltage drop of a lithium-ion secondary battery is removed. As described above, the voltage equivalent to the voltage drop is a voltage obtained by subtracting a product of a current flowing through the lithium-ion secondary battery and an internal resistance of the lithium-ion secondary battery from a voltage of the lithium-ion secondary battery. The first battery voltage calculating unit 1001 determines whether the calculated degree of increase in absolute value of the discharge voltage differential coefficient is greater than a predetermined threshold value. Based on a determination that the degree of increase in absolute value of the discharge voltage differential coefficient is greater than the predetermined threshold value, the first battery voltage calculating unit 1001 obtains the first battery voltage (discharging differential coefficient increase voltage $V_{dcp}$) at a start of a sharp increase in the absolute value of the discharge voltage differential coefficient (that is, at a timing when the first battery voltage calculating unit 1001 determines that the degree of increase in absolute value of the discharge voltage differential coefficient is greater than the predetermined threshold value). The discharging differential coefficient increase voltage $V_{dcp}$ corresponds to the above-described increase point of the first differential coefficient of the discharge curve.

The second battery voltage calculating unit 1002 calculates the second battery voltage (unsafe sign point $V_{USP}$).

Specifically, the second battery voltage calculating unit 1002 substitutes the first battery voltage (discharging differential coefficient increase voltage $V_{dcp}$) into, for example, the model expression represented by Expression (3) below to calculate the second battery voltage (unsafe sign point $V_{USP}$). Note that the unsafe sign point $V_{USP}$ corresponds to the above-described overcharge temperature increase point (heat generation point in the overcharge region).

$$V_{USP} = -0.2310 V_{dcp} + 5.1957 \quad (3)$$

As described above, the approximation expression representing the unsafe sign point $V_{USP}$ varies depending on the type and design of the lithium-ion battery (thus is not limited to Expression (3) above). The approximation expression is defined through investigation of a voltage at which heat absorption changes to heat generation during overcharging and a voltage at which the absolute value of the rate of change in voltage starts to change greatly in the last stage of discharging for cells with different degrees of deterioration in a certain lithium-ion battery.

The determining unit 1003 determines a safe state of the lithium-ion secondary battery, based on the second battery voltage (unsafe sign point $V_{USP}$).

For example, the determining unit 1003 calculates a safe level of the lithium-ion secondary batter, and rates the safe level of the lithium-ion secondary battery as a rank A, B, or C. Thresholds for the respective ranks are as follows. For example, for the rank A, a condition [$V_{USP} > \beta_A$ ($\beta_A$=4.60 V)], which indicates "the battery is currently safe", is used. For the rank B, a condition [$\beta_A > V_{USP} > \beta_B$ ($\beta_B$=4.57 V)], which indicates "the battery possibly becomes unsafe in the near future", is used. For the rank C, a condition [$\beta_B > V_{USP} > \beta_C$ ($\beta_C$=4.55 V)], which indicates that "the occurrence of an unsafe incident is highly likely, and stop using the battery and replacement of the battery are strongly recommended", is used. With such thresholds, the rank is determined. The determining unit 1003 may display the determined result or may store the determined result in a memory.

Each of the functions in the above-described embodiments may be implemented by one or more processing circuits or circuitry. As used herein, the term "processing circuit or circuitry" includes a processor programmed to implement each function by software, such as a processor implemented by an electronic circuit, and devices designed to implement each function described above, such as an application specific integrated circuit (ASIC), a digital signal processor (DSP), a field programmable gate array (FPGA), and existing circuit modules.

Any one of the above-described operations may be performed in various other ways, for example, in an order different from the one described above.

The invention claimed is:

1. A safe state detection method for a lithium-ion secondary battery, comprising:
   calculating an absolute value of a differential coefficient of a discharge curve from which a voltage equivalent to a voltage drop of the lithium-ion secondary battery is removed;
   determining a first battery voltage when the degree of increase in the absolute value of the differential coefficient is greater than a threshold value;
   determining a second battery voltage at a start of an increase in oxidation heat in response to the first battery voltage, the oxidation heat being heat generated inside the lithium-ion secondary battery when the lithium-ion secondary battery is overcharged; and
   detecting a safe state of the lithium-ion secondary battery, based on the determined second battery voltage.

2. The safe state detection method for a lithium-ion secondary battery according to claim 1, wherein
   the degree of increase indicates the degree of increase of the calculated absolute value of the differential coefficient increases, with respect to an absolute value of a differential coefficient calculated immediately before the calculated absolute value of the differential coefficient, and
   the threshold value is set to the degree of increase of 1.5 times.

3. The safe state detection method for a lithium-ion secondary battery according to claim 2, wherein the voltage equivalent to the voltage drop is a voltage obtained by subtracting a product of a current flowing through the lithium-ion secondary battery and an internal resistance of the lithium-ion secondary battery from a voltage of the lithium-ion secondary battery.

4. The safe state detection method for a lithium-ion secondary battery according to claim 3, further comprising:
   updating the discharge curve, based on the voltage equivalent to the voltage drop, in a case where a storage electricity quantity of the lithium-ion secondary battery is equal to X (Ah) and an absolute value of the current flowing through the lithium-ion secondary battery satisfies a condition of X (A) or greater, wherein
   X is a positive real number.

5. The safe state detection method for a lithium-ion secondary battery according to claim 4, further comprising:
   predicting a storable electricity quantity of the lithium-ion secondary battery, based on the first battery voltage.

6. The safe state detection method for a lithium-ion secondary battery according to claim 5, wherein
   a positive electrode active material of the lithium-ion secondary battery includes $Li_xMO_2$, and
   M denotes a transition metal and x<0.5 holds in response to the lithium-ion secondary battery being charged to 3.8 V.

7. A safe state detection apparatus comprising circuitry configured to:
   calculate an absolute value of a differential coefficient of a discharge curve from which a voltage equivalent to a voltage drop of a lithium-ion secondary battery is removed, and determine a first battery voltage when the degree of increase in the absolute value of the differential coefficient is greater than a threshold value;
   determine a second battery voltage at a start of an increase in oxidation heat in response to the first battery voltage, the oxidation heat being heat generated inside the lithium-ion secondary battery when the lithium-ion secondary battery is overcharged; and
   detect a safe state of the lithium-ion secondary battery, based on the determined second battery voltage.

8. A power storage device comprising:
   a lithium-ion secondary battery; and
   a protection circuit configured to function as the safe state detection apparatus according to claim 7.

9. The power storage device according to claim 8, wherein the lithium-ion secondary battery includes a used lithium-ion secondary battery.

10. A safe state detection system comprising:
    a lithium-ion secondary battery; and
    the safe state detection apparatus according to claim 7.

11. The safe state detection system according to claim 10, further comprising:
    a display configured to present a result corresponding to a determined rank of the safe state of the lithium-ion secondary battery.

12. The safe state detection system according to claim 10, further comprising:
    a power supply including the lithium-ion secondary battery,
    wherein the power supply is used in at least one of a drive apparatus, a power control device, or a power balance adjusting apparatus.

13. A non-transitory recording medium which, when executed by one or more processors, causes the processors to perform a safe state detection method for a lithium-ion secondary battery, comprising:
    calculating an absolute value of a differential coefficient of a discharge curve from which a voltage equivalent to a voltage drop of the lithium-ion secondary battery is removed;
    determining a first battery voltage when the degree of increase in the absolute value of the differential coefficient is greater than a threshold value;
    determining a second battery voltage at a start of an increase in oxidation heat in response to the first battery voltage, the oxidation heat being heat generated inside the lithium-ion secondary battery when the lithium-ion secondary battery is overcharged; and
    detecting a safe state of the lithium-ion secondary battery, based on the determined second battery voltage.

* * * * *